(12) United States Patent
Borthakur

(10) Patent No.: US 8,610,279 B2
(45) Date of Patent: Dec. 17, 2013

(54) MICROFEATURE WORKPIECES HAVING CONDUCTIVE INTERCONNECT STRUCTURES FORMED BY CHEMICALLY REACTIVE PROCESSES, AND ASSOCIATED SYSTEMS AND METHODS

(75) Inventor: Swarnal Borthakur, Boise, ID (US)

(73) Assignee: Micron Technologies, Inc., Boise, ID (US)

( * ) Notice: Subject to any disclaimer, the term of this patent is extended or adjusted under 35 U.S.C. 154(b) by 340 days.

(21) Appl. No.: 13/169,134

(22) Filed: Jun. 27, 2011

(65) Prior Publication Data

US 2011/0256711 A1  Oct. 20, 2011

Related U.S. Application Data

(60) Continuation of application No. 12/624,215, filed on Nov. 23, 2009, now Pat. No. 7,973,411, which is a division of application No. 11/511,690, filed on Aug. 28, 2006, now Pat. No. 7,629,249.

(51) Int. Cl.
*H01L 23/48* (2006.01)
(52) U.S. Cl.
USPC .................................. 257/762; 257/E23.141
(58) Field of Classification Search
USPC .......... 257/762, 774, 775, E23.141, E23.151, 257/E23.154
See application file for complete search history.

(56) References Cited

U.S. PATENT DOCUMENTS

| | | |
|---|---|---|
| 2,821,959 A | 2/1958 | Franz |
| 3,006,318 A | 10/1961 | Monroe, Jr. et al. |
| 3,345,134 A | 10/1967 | Heymer et al. |
| 3,865,298 A | 2/1975 | Allen et al. |
| 3,902,036 A | 8/1975 | Zaleckas |
| 4,040,168 A | 8/1977 | Huang |
| 4,368,106 A | 1/1983 | Anthony |
| 4,534,100 A | 8/1985 | Lane |
| 4,581,301 A | 4/1986 | Michaelson |

(Continued)

FOREIGN PATENT DOCUMENTS

| | | |
|---|---|---|
| DE | 10205026 C1 | 5/2003 |
| EP | 0127946 A1 | 12/1984 |

(Continued)

OTHER PUBLICATIONS

Aachboun, S. and P. Ranson, "Cryogenic etching of deep narrow trenches in silicon," J. Vac. Sci. Technol. A 18 (4), Jul./Aug. 2000, pp. 1848-1852.

(Continued)

*Primary Examiner* — Quoc Hoang
(74) *Attorney, Agent, or Firm* — Perkins Coie LLP

(57) ABSTRACT

Microfeature workpieces having conductive vias formed by chemically reactive processes, and associated systems and methods are disclosed. A method in accordance with one embodiment includes disposing a conductive lining on walls of a via in a microfeature workpiece, so that a space is located between opposing portions of the lining facing toward each other from opposing portions of the wall. The method can further include chemically reacting the lining with a reactive material to form a chemical compound from a constituent of the reactive material and a constituent of the lining. The method can still further include at least partially filling the space with the compound. In particular embodiments, the conductive lining includes copper, the reactive material includes sulfur hexafluoride, and the chemical compound that at least partially fills the space in the via includes copper sulfide.

21 Claims, 14 Drawing Sheets

(56) References Cited

U.S. PATENT DOCUMENTS

| | | |
|---|---|---|
| 4,608,480 A | 8/1986 | Bizot et al. |
| 4,614,427 A | 9/1986 | Koizumi et al. |
| 4,627,971 A | 12/1986 | Ayer |
| 4,660,063 A | 4/1987 | Anthony |
| 4,756,765 A | 7/1988 | Woodroffe |
| 4,768,291 A | 9/1988 | Palmer |
| 4,818,728 A | 4/1989 | Rai et al. |
| 4,907,127 A | 3/1990 | Lee |
| 4,959,705 A | 9/1990 | Lemnios et al. |
| 4,964,212 A | 10/1990 | Deroux-Dauphin et al. |
| 4,984,597 A | 1/1991 | McConnell et al. |
| 5,024,966 A | 6/1991 | Dietrich et al. |
| 5,026,964 A | 6/1991 | Somers et al. |
| 5,027,184 A | 6/1991 | Soclof |
| 5,037,782 A | 8/1991 | Nakamura et al. |
| 5,123,902 A | 6/1992 | Muller et al. |
| 5,145,099 A | 9/1992 | Wood et al. |
| 5,158,911 A | 10/1992 | Quentin et al. |
| 5,219,344 A | 6/1993 | Yoder, Jr. |
| 5,233,448 A | 8/1993 | Wu et al. |
| 5,237,148 A | 8/1993 | Aoki et al. |
| 5,289,631 A | 3/1994 | Koopman et al. |
| 5,292,686 A | 3/1994 | Riley et al. |
| 5,294,568 A | 3/1994 | McNeilly et al. |
| 5,304,743 A | 4/1994 | Sen et al. |
| 5,378,312 A | 1/1995 | Gifford et al. |
| 5,378,313 A | 1/1995 | Pace |
| 5,380,681 A | 1/1995 | Hsu et al. |
| 5,402,435 A | 3/1995 | Shiono et al. |
| 5,406,630 A | 4/1995 | Piosenka et al. |
| 5,424,573 A | 6/1995 | Kato et al. |
| 5,438,212 A | 8/1995 | Okaniwa et al. |
| 5,447,871 A | 9/1995 | Goldstein |
| 5,464,960 A | 11/1995 | Hall et al. |
| 5,470,787 A | 11/1995 | Greer |
| 5,480,835 A | 1/1996 | Carney et al. |
| 5,481,483 A | 1/1996 | Ebenstein |
| 5,496,755 A | 3/1996 | Bayraktaroglu |
| 5,515,167 A | 5/1996 | Ledger et al. |
| 5,518,956 A | 5/1996 | Liu et al. |
| 5,585,308 A | 12/1996 | Sardella |
| 5,585,675 A | 12/1996 | Knopf |
| 5,614,743 A | 3/1997 | Mochizuki et al. |
| 5,618,752 A | 4/1997 | Gaul |
| 5,624,437 A | 4/1997 | Freeman et al. |
| 5,627,106 A | 5/1997 | Hsu et al. |
| 5,646,067 A | 7/1997 | Gaul |
| 5,654,221 A | 8/1997 | Cronin et al. |
| 5,673,846 A | 10/1997 | Gruber |
| 5,684,642 A | 11/1997 | Zumoto et al. |
| 5,690,841 A | 11/1997 | Elderstig et al. |
| 5,718,791 A | 2/1998 | Spengler et al. |
| 5,723,904 A | 3/1998 | Shiga |
| 5,726,493 A | 3/1998 | Yamashita et al. |
| 5,771,158 A | 6/1998 | Yamagishi et al. |
| 5,773,359 A | 6/1998 | Mitchell et al. |
| 5,776,824 A | 7/1998 | Farnworth et al. |
| 5,807,439 A | 9/1998 | Akatsu et al. |
| 5,811,799 A | 9/1998 | Wu |
| 5,814,889 A | 9/1998 | Gaul |
| 5,821,532 A | 10/1998 | Beaman et al. |
| 5,825,080 A | 10/1998 | Imaoka et al. |
| 5,826,628 A | 10/1998 | Hamilton |
| 5,847,454 A | 12/1998 | Shaw et al. |
| 5,851,845 A | 12/1998 | Wood et al. |
| 5,857,963 A | 1/1999 | Pelchy et al. |
| 5,861,654 A | 1/1999 | Johnson |
| 5,870,289 A | 2/1999 | Tokuda et al. |
| 5,870,823 A | 2/1999 | Bezama et al. |
| 5,893,828 A | 4/1999 | Uram |
| 5,903,058 A | 5/1999 | Akram |
| 5,904,499 A | 5/1999 | Pace |
| 5,969,422 A | 10/1999 | Ting et al. |
| 5,998,240 A | 12/1999 | Hamilton et al. |
| 5,998,292 A | 12/1999 | Black et al. |
| 6,004,867 A | 12/1999 | Kim et al. |
| 6,008,070 A | 12/1999 | Farnworth |
| 6,008,914 A | 12/1999 | Sasagawa et al. |
| 6,080,291 A | 6/2000 | Woodruff et al. |
| 6,097,087 A | 8/2000 | Farnworth et al. |
| 6,103,547 A | 8/2000 | Corisis et al. |
| 6,107,180 A | 8/2000 | Munroe et al. |
| 6,107,679 A | 8/2000 | Noguchi |
| 6,110,825 A | 8/2000 | Mastromatteo et al. |
| 6,114,240 A | 9/2000 | Akram et al. |
| 6,119,335 A | 9/2000 | Park et al. |
| 6,124,634 A | 9/2000 | Akram et al. |
| 6,130,141 A | 10/2000 | Degani et al. |
| 6,133,622 A | 10/2000 | Corisis et al. |
| 6,137,182 A | 10/2000 | Hause et al. |
| 6,140,604 A | 10/2000 | Somers et al. |
| 6,143,588 A | 11/2000 | Glenn |
| 6,148,509 A | 11/2000 | Schoenfeld et al. |
| 6,159,764 A | 12/2000 | Kinsman et al. |
| 6,180,518 B1 | 1/2001 | Layadi et al. |
| 6,184,060 B1 | 2/2001 | Siniaguine |
| 6,184,465 B1 | 2/2001 | Corisis |
| 6,187,615 B1 | 2/2001 | Kim et al. |
| 6,191,487 B1 | 2/2001 | Rodenbeck et al. |
| 6,197,181 B1 | 3/2001 | Chen |
| 6,203,539 B1 | 3/2001 | Shimmick et al. |
| 6,221,769 B1 | 4/2001 | Dhong et al. |
| 6,222,136 B1 | 4/2001 | Appelt et al. |
| 6,222,270 B1 | 4/2001 | Lee et al. |
| 6,228,687 B1 | 5/2001 | Akram et al. |
| 6,229,202 B1 | 5/2001 | Corisis |
| 6,235,552 B1 | 5/2001 | Kwon et al. |
| 6,246,108 B1 | 6/2001 | Corisis et al. |
| 6,252,300 B1 | 6/2001 | Hsuan et al. |
| 6,268,114 B1 | 7/2001 | Wen et al. |
| 6,271,580 B1 | 8/2001 | Corisis |
| 6,277,757 B1 | 8/2001 | Lin et al. |
| 6,291,894 B1 | 9/2001 | Farnworth et al. |
| 6,294,837 B1 | 9/2001 | Akram et al. |
| 6,297,155 B1 | 10/2001 | Simpson et al. |
| 6,324,253 B1 | 11/2001 | Yuyama et al. |
| 6,326,689 B1 | 12/2001 | Thomas |
| 6,326,697 B1 | 12/2001 | Farnworth |
| 6,329,632 B1 | 12/2001 | Fournier et al. |
| 6,341,009 B1 | 1/2002 | O'Connor et al. |
| 6,344,976 B1 | 2/2002 | Schoenfeld et al. |
| 6,359,254 B1 | 3/2002 | Brown |
| 6,359,328 B1 | 3/2002 | Dubin |
| 6,372,548 B2 | 4/2002 | Bessho et al. |
| 6,388,208 B1 | 5/2002 | Kiani et al. |
| 6,391,770 B2 | 5/2002 | Kosaki et al. |
| 6,406,636 B1 | 6/2002 | Vaganov |
| 6,432,821 B1 | 8/2002 | Dubin et al. |
| 6,433,303 B1 | 8/2002 | Liu et al. |
| 6,433,304 B2 | 8/2002 | Okumura et al. |
| 6,437,284 B1 | 8/2002 | Okamoto et al. |
| 6,437,441 B1 | 8/2002 | Yamamoto et al. |
| 6,441,487 B2 | 8/2002 | Elenius et al. |
| 6,444,576 B1 | 9/2002 | Kong |
| 6,452,270 B1 | 9/2002 | Huang et al. |
| 6,457,515 B1 | 10/2002 | Vafai et al. |
| 6,459,039 B1 | 10/2002 | Bezama et al. |
| 6,459,150 B1 | 10/2002 | Wu et al. |
| 6,468,889 B1 | 10/2002 | Iacoponi et al. |
| 6,486,083 B1 | 11/2002 | Mizuno et al. |
| 6,486,549 B1 | 11/2002 | Chiang et al. |
| 6,521,516 B2 | 2/2003 | Monzon et al. |
| 6,521,530 B2 | 2/2003 | Peters et al. |
| 6,534,192 B1 | 3/2003 | Abys et al. |
| 6,534,863 B2 | 3/2003 | Walker et al. |
| 6,545,563 B1 | 4/2003 | Smith |
| 6,555,782 B2 | 4/2003 | Isaji et al. |
| 6,560,047 B2 | 5/2003 | Choi et al. |
| 6,562,709 B1 | 5/2003 | Lin |
| 6,569,711 B1 | 5/2003 | Susko et al. |
| 6,569,777 B1 | 5/2003 | Hsu et al. |
| 6,572,606 B2 | 6/2003 | Kliewer et al. |
| 6,576,531 B2 | 6/2003 | Peng et al. |
| 6,580,174 B2 | 6/2003 | McCormick et al. |

(56) References Cited

U.S. PATENT DOCUMENTS

| | | |
|---|---|---|
| 6,582,987 B2 | 6/2003 | Jun et al. |
| 6,582,992 B2 | 6/2003 | Poo et al. |
| 6,593,644 B2 | 7/2003 | Chiu et al. |
| 6,599,436 B1 | 7/2003 | Matzke et al. |
| 6,606,251 B1 | 8/2003 | Kenny, Jr. et al. |
| 6,614,033 B2 | 9/2003 | Suguro et al. |
| 6,620,031 B2 | 9/2003 | Renteln |
| 6,620,731 B1 | 9/2003 | Farnworth et al. |
| 6,621,045 B1 | 9/2003 | Liu et al. |
| 6,638,410 B2 | 10/2003 | Chen et al. |
| 6,653,236 B2 | 11/2003 | Wai et al. |
| 6,658,818 B2 | 12/2003 | Kurth et al. |
| 6,660,622 B2 | 12/2003 | Chen et al. |
| 6,660,630 B1 | 12/2003 | Chang et al. |
| 6,664,129 B2 | 12/2003 | Siniaguine |
| 6,664,485 B2 | 12/2003 | Bhatt et al. |
| 6,667,551 B2 | 12/2003 | Hanaoka et al. |
| 6,680,459 B2 | 1/2004 | Kanaya et al. |
| 6,699,787 B2 | 3/2004 | Mashino et al. |
| 6,703,310 B2 | 3/2004 | Mashino et al. |
| 6,708,405 B2 | 3/2004 | Hasler et al. |
| 6,746,971 B1 | 6/2004 | Ngo et al. |
| 6,750,144 B2 | 6/2004 | Taylor |
| 6,756,564 B2 | 6/2004 | Tian |
| 6,770,958 B2 | 8/2004 | Wang et al. |
| 6,774,486 B2 | 8/2004 | Kinsman |
| 6,777,244 B2 | 8/2004 | Pepper et al. |
| 6,780,749 B2 | 8/2004 | Masumoto et al. |
| 6,790,775 B2 | 9/2004 | Fartash |
| 6,797,616 B2 | 9/2004 | Kinsman |
| 6,809,025 B2 | 10/2004 | Sandhu et al. |
| 6,809,421 B1 | 10/2004 | Hayasaka et al. |
| 6,818,464 B2 | 11/2004 | Heschel et al. |
| 6,825,127 B2 | 11/2004 | Ouellet et al. |
| 6,825,557 B2 | 11/2004 | DiBattista et al. |
| 6,828,175 B2 | 12/2004 | Wood et al. |
| 6,828,223 B2 | 12/2004 | Chuang |
| 6,838,377 B2 | 1/2005 | Tonami et al. |
| 6,841,849 B2 | 1/2005 | Miyazawa |
| 6,852,621 B2 | 2/2005 | Hanaoka et al. |
| 6,856,023 B2 | 2/2005 | Muta et al. |
| 6,858,891 B2 | 2/2005 | Farnworth et al. |
| 6,864,172 B2 | 3/2005 | Noma et al. |
| 6,864,457 B1 | 3/2005 | Alexander et al. |
| 6,867,390 B2 | 3/2005 | Clauer et al. |
| 6,873,054 B2 | 3/2005 | Miyazawa et al. |
| 6,882,030 B2 | 4/2005 | Siniaguine |
| 6,885,107 B2 | 4/2005 | Kinsman |
| 6,903,012 B2 | 6/2005 | Geefay et al. |
| 6,903,442 B2 | 6/2005 | Wood et al. |
| 6,903,443 B2 | 6/2005 | Farnworth et al. |
| 6,910,268 B2 | 6/2005 | Miller |
| 6,913,952 B2 | 7/2005 | Moxham et al. |
| 6,916,725 B2 | 7/2005 | Yamaguchi et al. |
| 6,936,536 B2 | 8/2005 | Sinha |
| 6,939,343 B2 | 9/2005 | Sumiya |
| 6,943,056 B2 | 9/2005 | Nemoto et al. |
| 6,946,325 B2 | 9/2005 | Yean et al. |
| 6,951,627 B2 | 10/2005 | Li et al. |
| 6,953,748 B2 | 10/2005 | Yamaguchi et al. |
| 6,962,867 B2 | 11/2005 | Jackson et al. |
| 6,970,775 B2 | 11/2005 | Lederle et al. |
| 6,982,487 B2 | 1/2006 | Kim et al. |
| 7,022,609 B2 | 4/2006 | Yamamoto et al. |
| 7,023,090 B2 | 4/2006 | Huang et al. |
| 7,029,937 B2 | 4/2006 | Miyazawa et al. |
| 7,033,927 B2 | 4/2006 | Cohen et al. |
| 7,037,836 B2 | 5/2006 | Lee |
| 7,041,598 B2 | 5/2006 | Sharma |
| 7,045,015 B2 | 5/2006 | Renn et al. |
| 7,083,425 B2 | 8/2006 | Chong et al. |
| 7,084,073 B2 | 8/2006 | Lee et al. |
| 7,088,001 B2 * | 8/2006 | Ashihara et al. ............... 257/773 |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,109,068 B2 | 9/2006 | Akram et al. |
| 7,129,112 B2 | 10/2006 | Matsuo |
| 7,151,009 B2 | 12/2006 | Kim et al. |
| 7,164,565 B2 | 1/2007 | Takeda |
| 7,166,247 B2 | 1/2007 | Kramer |
| 7,170,183 B1 | 1/2007 | Kim et al. |
| 7,183,176 B2 | 2/2007 | Sankarapillai et al. |
| 7,183,653 B2 | 2/2007 | Myers et al. |
| 7,186,650 B1 | 3/2007 | Dakshina-Murthy |
| 7,190,061 B2 | 3/2007 | Lee et al. |
| 7,199,050 B2 | 4/2007 | Hiatt |
| 7,214,615 B2 | 5/2007 | Miyazawa |
| 7,217,596 B2 | 5/2007 | Cobbley et al. |
| 7,217,888 B2 | 5/2007 | Sunohara et al. |
| 7,223,634 B2 | 5/2007 | Yamaguchi |
| 7,232,754 B2 | 6/2007 | Kirby et al. |
| 7,256,073 B2 | 8/2007 | Noma et al. |
| 7,262,134 B2 | 8/2007 | Kirby et al. |
| 7,262,495 B2 | 8/2007 | Chen et al. |
| 7,265,052 B2 | 9/2007 | Sinha |
| 7,271,482 B2 | 9/2007 | Kirby |
| 7,279,776 B2 | 10/2007 | Morimoto |
| 7,300,857 B2 | 11/2007 | Akram et al. |
| 7,317,256 B2 | 1/2008 | Williams et al. |
| 7,408,265 B2 | 8/2008 | Holscher et al. |
| 7,491,582 B2 | 2/2009 | Yokoyama et al. |
| 7,498,661 B2 | 3/2009 | Matsuo |
| 7,629,249 B2 | 12/2009 | Borthakur |
| 7,709,958 B2 | 5/2010 | Cohen |
| 7,973,411 B2 | 7/2011 | Borthakur |
| 2001/0020739 A1 | 9/2001 | Honda |
| 2002/0005583 A1 | 1/2002 | Harada et al. |
| 2002/0020898 A1 | 2/2002 | Vu et al. |
| 2002/0027293 A1 | 3/2002 | Hoshino |
| 2002/0057468 A1 | 5/2002 | Segawa et al. |
| 2002/0059722 A1 | 5/2002 | Murakami |
| 2002/0060208 A1 | 5/2002 | Liu et al. |
| 2002/0094607 A1 | 7/2002 | Gebauer et al. |
| 2002/0096729 A1 | 7/2002 | Tu et al. |
| 2002/0130390 A1 | 9/2002 | Ker et al. |
| 2002/0190371 A1 | 12/2002 | Mashino et al. |
| 2003/0014895 A1 | 1/2003 | Lizotte |
| 2003/0042564 A1 | 3/2003 | Taniguchi et al. |
| 2003/0119308 A1 | 6/2003 | Geefay et al. |
| 2003/0148597 A1 | 8/2003 | Tan et al. |
| 2003/0216023 A1 | 11/2003 | Wark et al. |
| 2004/0004280 A1 | 1/2004 | Shibata |
| 2004/0014312 A1 | 1/2004 | Kunishima et al. |
| 2004/0018712 A1 | 1/2004 | Plas et al. |
| 2004/0023447 A1 | 2/2004 | Hirakata et al. |
| 2004/0041261 A1 | 3/2004 | Kinsman |
| 2004/0043607 A1 | 3/2004 | Farnworth et al. |
| 2004/0046251 A1 | 3/2004 | Lee |
| 2004/0073607 A1 | 4/2004 | Su et al. |
| 2004/0087441 A1 | 5/2004 | Bock et al. |
| 2004/0094389 A1 | 5/2004 | Boyce |
| 2004/0121267 A1 | 6/2004 | Jang |
| 2004/0137661 A1 | 7/2004 | Murayama |
| 2004/0137701 A1 | 7/2004 | Takao |
| 2004/0141536 A1 | 7/2004 | Liu et al. |
| 2004/0159668 A1 | 8/2004 | Vasiadis |
| 2004/0159958 A1 | 8/2004 | Funaki |
| 2004/0178491 A1 | 9/2004 | Akram et al. |
| 2004/0180539 A1 | 9/2004 | Yamamoto et al. |
| 2004/0188260 A1 | 9/2004 | Bonkabeta et al. |
| 2004/0192033 A1 | 9/2004 | Hara |
| 2004/0198033 A1 | 10/2004 | Lee et al. |
| 2004/0198040 A1 | 10/2004 | Geefay et al. |
| 2004/0219342 A1 | 11/2004 | Boggs et al. |
| 2004/0219763 A1 | 11/2004 | Kim et al. |
| 2004/0222082 A1 | 11/2004 | Gopalraja et al. |
| 2004/0245649 A1 | 12/2004 | Imaoka |
| 2004/0255258 A1 | 12/2004 | Li |
| 2004/0262753 A1 | 12/2004 | Kashiwazaki |
| 2004/0265562 A1 | 12/2004 | Uzoh et al. |
| 2005/0026443 A1 | 2/2005 | Goo et al. |
| 2005/0037608 A1 | 2/2005 | Andricacos et al. |
| 2005/0046002 A1 | 3/2005 | Lee et al. |

(56) References Cited

U.S. PATENT DOCUMENTS

| | | |
|---|---|---|
| 2005/0048776 A1 | 3/2005 | Papa Rao et al. |
| 2005/0064707 A1 | 3/2005 | Sinha |
| 2005/0067620 A1 | 3/2005 | Chan et al. |
| 2005/0069782 A1 | 3/2005 | Elenius et al. |
| 2005/0085066 A1 | 4/2005 | Tsao et al. |
| 2005/0101054 A1 | 5/2005 | Mastromatteo et al. |
| 2005/0101116 A1 | 5/2005 | Tseng |
| 2005/0104228 A1 | 5/2005 | Rigg et al. |
| 2005/0106834 A1 | 5/2005 | Andry et al. |
| 2005/0110095 A1 | 5/2005 | Shih et al. |
| 2005/0110889 A1 | 5/2005 | Tuttle et al. |
| 2005/0127478 A1 | 6/2005 | Hiatt et al. |
| 2005/0136646 A1 | 6/2005 | Larnerd et al. |
| 2005/0139390 A1 | 6/2005 | Kim et al. |
| 2005/0150683 A1 | 7/2005 | Farnworth et al. |
| 2005/0151228 A1 | 7/2005 | Tanida et al. |
| 2005/0164500 A1 | 7/2005 | Lindgren |
| 2005/0184219 A1 | 8/2005 | Kirby |
| 2005/0189637 A1 | 9/2005 | Okayama et al. |
| 2005/0191861 A1 | 9/2005 | Verhaverbeke |
| 2005/0194169 A1 | 9/2005 | Tonomura |
| 2005/0208766 A1 | 9/2005 | Kirby et al. |
| 2005/0227382 A1 | 10/2005 | Hui |
| 2005/0231626 A1 | 10/2005 | Tuttle et al. |
| 2005/0236708 A1 | 10/2005 | Farnworth et al. |
| 2005/0247894 A1 | 11/2005 | Watkins et al. |
| 2005/0253213 A1 | 11/2005 | Jiang et al. |
| 2005/0254133 A1 | 11/2005 | Akram et al. |
| 2005/0258530 A1 | 11/2005 | Vindasius et al. |
| 2005/0260851 A1 | 11/2005 | Huang et al. |
| 2005/0272221 A1 | 12/2005 | Yen et al. |
| 2005/0275048 A1 | 12/2005 | Farnworth et al. |
| 2005/0275049 A1 | 12/2005 | Kirby et al. |
| 2005/0275051 A1 | 12/2005 | Farnworth et al. |
| 2005/0275096 A1 | 12/2005 | Zeng et al. |
| 2005/0275750 A1 | 12/2005 | Akram et al. |
| 2005/0277293 A1 | 12/2005 | Kim et al. |
| 2005/0282374 A1 | 12/2005 | Hwang et al. |
| 2005/0285154 A1 | 12/2005 | Akram et al. |
| 2006/0003566 A1 | 1/2006 | Emesh |
| 2006/0011809 A1 | 1/2006 | Farnworth et al. |
| 2006/0014313 A1 | 1/2006 | Hall et al. |
| 2006/0023107 A1 | 2/2006 | Bolken et al. |
| 2006/0024856 A1 | 2/2006 | Derderian et al. |
| 2006/0035402 A1 | 2/2006 | Street et al. |
| 2006/0035415 A1 | 2/2006 | Wood et al. |
| 2006/0038183 A1 | 2/2006 | Oliver |
| 2006/0038272 A1 | 2/2006 | Edwards |
| 2006/0040421 A1 | 2/2006 | Farnworth et al. |
| 2006/0040428 A1 | 2/2006 | Johnson |
| 2006/0042952 A1 | 3/2006 | Oliver et al. |
| 2006/0043262 A1 | 3/2006 | Akram |
| 2006/0043509 A1 | 3/2006 | Watkins et al. |
| 2006/0043512 A1 | 3/2006 | Oliver et al. |
| 2006/0043569 A1 | 3/2006 | Benson et al. |
| 2006/0043599 A1 | 3/2006 | Akram et al. |
| 2006/0044433 A1 | 3/2006 | Akram |
| 2006/0046332 A1 | 3/2006 | Derderian et al. |
| 2006/0046438 A1 | 3/2006 | Kirby |
| 2006/0046468 A1 | 3/2006 | Akram et al. |
| 2006/0046471 A1 | 3/2006 | Kirby et al. |
| 2006/0046537 A1 | 3/2006 | Chong et al. |
| 2006/0057776 A1 | 3/2006 | Tao |
| 2006/0057836 A1 | 3/2006 | Nagarajan et al. |
| 2006/0071347 A1 | 4/2006 | Dotta |
| 2006/0148250 A1 | 7/2006 | Kirby |
| 2006/0151880 A1 | 7/2006 | Tang et al. |
| 2006/0154153 A1 | 7/2006 | Chiang et al. |
| 2006/0160367 A1 | 7/2006 | Wai et al. |
| 2006/0177959 A1 | 8/2006 | Boettiger et al. |
| 2006/0177999 A1 | 8/2006 | Hembree et al. |
| 2006/0180941 A1 | 8/2006 | Kirby et al. |
| 2006/0186097 A1 | 8/2006 | Watkins et al. |
| 2006/0186492 A1 | 8/2006 | Boettiger et al. |
| 2006/0191882 A1 | 8/2006 | Watkins et al. |
| 2006/0195729 A1 | 8/2006 | Huppenthal et al. |
| 2006/0199363 A1 | 9/2006 | Kirby et al. |
| 2006/0204651 A1 | 9/2006 | Wai et al. |
| 2006/0208360 A1 | 9/2006 | Yiu et al. |
| 2006/0216862 A1 | 9/2006 | Rigg et al. |
| 2006/0223301 A1 | 10/2006 | Vanhaelemeersch et al. |
| 2006/0240687 A1 | 10/2006 | Chong et al. |
| 2006/0249849 A1 | 11/2006 | Cohen |
| 2006/0252254 A1 | 11/2006 | Basol |
| 2006/0252262 A1 | 11/2006 | Kazemi |
| 2006/0255443 A1 | 11/2006 | Hwang et al. |
| 2006/0264041 A1 | 11/2006 | Rigg et al. |
| 2006/0270108 A1 | 11/2006 | Farnworth et al. |
| 2006/0278979 A1 | 12/2006 | Rangel |
| 2006/0278980 A1 | 12/2006 | Trezza et al. |
| 2006/0278988 A1 | 12/2006 | Trezza et al. |
| 2006/0278989 A1 | 12/2006 | Trezza |
| 2006/0281224 A1 | 12/2006 | Edelstein et al. |
| 2006/0281243 A1 | 12/2006 | Trezza |
| 2006/0289967 A1 | 12/2006 | Heck et al. |
| 2006/0289968 A1 | 12/2006 | Sulfridge |
| 2006/0290001 A1 | 12/2006 | Sulfridge |
| 2006/0292877 A1 | 12/2006 | Lake |
| 2007/0004079 A1 | 1/2007 | Geefay et al. |
| 2007/0012655 A1 | 1/2007 | Kwon et al. |
| 2007/0020805 A1 | 1/2007 | Kim et al. |
| 2007/0020935 A1 | 1/2007 | Taylor et al. |
| 2007/0023121 A1 | 2/2007 | Jones et al. |
| 2007/0032061 A1 | 2/2007 | Farnworth et al. |
| 2007/0035033 A1 | 2/2007 | Ozguz et al. |
| 2007/0037379 A1 | 2/2007 | Enquist et al. |
| 2007/0042598 A1 | 2/2007 | Park |
| 2007/0045120 A1 | 3/2007 | Tiwari et al. |
| 2007/0045388 A1 | 3/2007 | Farnworth et al. |
| 2007/0045515 A1 | 3/2007 | Farnworth et al. |
| 2007/0045632 A1 | 3/2007 | Oliver et al. |
| 2007/0045779 A1 | 3/2007 | Hiatt |
| 2007/0045806 A1 | 3/2007 | Hsuan |
| 2007/0045812 A1 | 3/2007 | Heng |
| 2007/0045826 A1 | 3/2007 | Lee et al. |
| 2007/0045834 A1 | 3/2007 | Chong et al. |
| 2007/0048896 A1 | 3/2007 | Andry et al. |
| 2007/0048994 A1 | 3/2007 | Tuttle |
| 2007/0049016 A1 | 3/2007 | Hiatt et al. |
| 2007/0049019 A1 | 3/2007 | Wai et al. |
| 2007/0057028 A1 | 3/2007 | Lake et al. |
| 2007/0077753 A1 | 4/2007 | Iwatake et al. |
| 2007/0082427 A1 | 4/2007 | Shirahama et al. |
| 2007/0096263 A1 | 5/2007 | Furukawa et al. |
| 2007/0099395 A1 | 5/2007 | Sridhar et al. |
| 2007/0111386 A1 | 5/2007 | Kim et al. |
| 2007/0122940 A1 | 5/2007 | Gautham |
| 2007/0125834 A1 | 6/2007 | Chew et al. |
| 2007/0138562 A1 | 6/2007 | Trezza |
| 2007/0145563 A1 | 6/2007 | Punzalan et al. |
| 2007/0152342 A1 | 7/2007 | Tsao et al. |
| 2007/0155997 A1 | 7/2007 | Li et al. |
| 2007/0158839 A1 | 7/2007 | Trezza |
| 2007/0158853 A1 | 7/2007 | Sinha |
| 2007/0161235 A1 | 7/2007 | Trezza |
| 2007/0166991 A1 | 7/2007 | Sinha |
| 2007/0166997 A1 | 7/2007 | Knorr |
| 2007/0167004 A1 | 7/2007 | Trezza |
| 2007/0170574 A1 | 7/2007 | Lauxtermann et al. |
| 2007/0178694 A1 | 8/2007 | Hiatt |
| 2007/0182020 A1 | 8/2007 | Trezza et al. |
| 2007/0190803 A1 | 8/2007 | Singh et al. |
| 2007/0197013 A1 | 8/2007 | Trezza |
| 2007/0202617 A1 | 8/2007 | Hembree |
| 2007/0222050 A1 | 9/2007 | Lee et al. |
| 2007/0222054 A1 | 9/2007 | Hembree |
| 2007/0228576 A1 | 10/2007 | Trezza |
| 2007/0228926 A1 | 10/2007 | Teo et al. |
| 2007/0262424 A1 | 11/2007 | Hiatt |
| 2007/0267138 A1 | 11/2007 | White et al. |
| 2007/0281473 A1 | 12/2007 | Clark et al. |
| 2007/0293040 A1 | 12/2007 | Emesh et al. |
| 2008/0006850 A1 | 1/2008 | Ribnicek et al. |
| 2008/0050904 A1 | 2/2008 | Lake |

(56) References Cited

U.S. PATENT DOCUMENTS

| | | |
|---|---|---|
| 2008/0050911 A1 | 2/2008 | Borthakur |
| 2008/0054444 A1 | 3/2008 | Tuttle |
| 2008/0057620 A1 | 3/2008 | Pratt |
| 2008/0079120 A1 | 4/2008 | Foster et al. |
| 2008/0079121 A1 | 4/2008 | Han |
| 2008/0081386 A1 | 4/2008 | Raravikar et al. |
| 2008/0081398 A1 | 4/2008 | Lee et al. |
| 2008/0265933 A1 | 10/2008 | Tanioka et al. |
| 2009/0007934 A1 | 1/2009 | Hutto |
| 2009/0014859 A1 | 1/2009 | Jeung et al. |
| 2009/0057912 A1 | 3/2009 | Kheng |
| 2009/0146312 A1 | 6/2009 | Sulfridge |
| 2009/0166846 A1 | 7/2009 | Pratt et al. |
| 2009/0283898 A1 | 11/2009 | Janzen et al. |

FOREIGN PATENT DOCUMENTS

| | | | |
|---|---|---|---|
| EP | 1154474 A1 | | 11/2001 |
| EP | 1415950 A2 | | 5/2004 |
| JP | 63052432 | A | 3/1988 |
| JP | 02235589 | A | 9/1990 |
| JP | 2001077496 | | 3/2001 |
| JP | 2001298147 | A | 10/2001 |
| JP | 2002018585 | A | 1/2002 |
| JP | 2005093980 | A | 4/2005 |
| JP | 2005310817 | A | 11/2005 |
| KR | 20010018694 | | 3/2001 |
| KR | 20020022122 | A | 3/2002 |
| KR | 20020061812 | A | 7/2002 |
| TW | 250597 | B | 3/2006 |
| WO | 2004109770 | A2 | 12/2004 |
| WO | 2005022965 | A2 | 3/2005 |
| WO | 2005036940 | A1 | 4/2005 |
| WO | 2006053036 | A2 | 5/2006 |
| WO | 2006124597 | A2 | 11/2006 |
| WO | 2007025812 | A1 | 3/2007 |
| WO | 2007043718 | A1 | 4/2007 |

OTHER PUBLICATIONS

Aachboun, S. and P. Ranson, "Deep anisotropic etching of silicon," J. Vac. Sci. Technol. A 17(4), Jul./Aug. 1999, pp. 2270-2273.

Amazawa, T. et al., "Planarized Multilevel Interconnection Using Chemical Mechanical Polishing of Selective Cvd-Al Via Plugs," IEEE Transactions on Electron Devices, vol. 45, No. 4, pp. 815-820, Apr. 1998.

Armacost, M. et al., "Plasma-Etching Processes for ULSI Semiconductor Circuits," IBM J. Res. Develop., vol. 43, No. 1/2, pp. 39-72, Jan./Mar. 1999, <http://www.research.ibm.com/journal/rd/431/armacost.pdf>.

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007-Jun. 1, 2007, pp. 1179-1185.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Blackburn, J.M. et al., "Deposition of Conformal Copper and Nickel Films from Supercritical Carbon Dioxide," Science, vol. 94, Oct. 2001, pp. 141-145.

Cheung, T.S.D. et al., "On-Chip Interconnect for mm-Wave Applications Using an All-Copper Technology and Wavelength Reduction," 2003 IEEE International Solid-State Circuits Conference.

Chou, Bill et al., "Ultra Via Substrate for Advanced BGA Applications," Pan Pacific Symposium, Jan. 25, 2000, <http://www.smta.org/files/PanPac00-ChouBill.pdf>.

De Boer, M.J. et al., "Micromachining of Buried Micro Channels in Silicon," Journal of Microelectromechanical Systems, vol. 9, No. 1, Mar. 2000, IEEE, ISSN: 1057-7157.

Gutmann, R.J., "Wafer-Level Three-Dimensional Monolithic Integration for Heterogeneous Silicon ICs," 2004 Topical Meeting on Silicon Monolithic Integrated Circuits in RF Systems, IEEE, Sep. 8-10, 2004, pp. 45-48.

Hirafune, S. et al., "Packaging Technology for Imager Using Through-hole Interconnection in Si Substrate," Proceeding of HDP'04, IEEE, pp. 303-306, Jul. 2004.

Jang, D.M. et al., "Development and Evaluation of 3-D SiP with Vertically Interconnected Through Silicon Vias (TSV)," Proceedings of the 57th Electronic Components and Technology Conference, IEEE, May 29, 2007-Jun. 1, 2007, pp. 847-852, ISBN: 1-4244-0985-3.

Kada, M. et al., "Advancements in Stacked Chip Scale Packaging (S-CSP) Provides System-in-a-Package Functionality for Wireless and Handheld Applications," Future Fab Intl., vol. 9, Jan. 7, 2000.

Keigler, A. et al., "Enabling 3-D Design," Semiconductor International, Aug. 2007.

Kim, J.Y. et al., "S-RCAT (Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8.

Kuhn, Markus and Jose A. Rodriguez, Adsorption of sulfur on bimetallic surfaces: Formation of copper sulfides on Pt(111) and Ru(001), J. Vac. Sci. Technol. A 13(3), pp. 1569-1573, May/Jun. 1995.

Kurita, Y. et al., "A 3D Stacked Memory Integrated on a Logic Device Using SMAFTI Technology," 2007 IEEE Electronic Components and Technology Conference, pp. 821-829, May 29-Jun. 1, 2007, ISBN 1-4244-0985-3.

Kyocera Corporation, Memory Package, 1 page, retrieved from the Internet on Dec. 3, 2004, <http://global.kyocera.com/prdct/semicon/ic_pkg/memory_p.html>.

Lee, How Ming, et al., Abstract of "Abatement of Sulfur Hexaflouride Emissions from the Semiconductor Manufacturing Process by Atmospheric-Pressure Plasmas," 1 page, Aug. 2004, <http:www.awma.org/journal/ShowAbstract.asp?Year=&PaperID=1256>.

Lee, Rex A. et al., "Laser Created Silicon Vias for Stacking Dies in MCMs," IEEE/CHMT IEMT Symposium, 1991, pp. 262-265.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Moffat, T.P., et al. "Superconformal film growth; Mechanism and quantification," IBM J. Res. & Dev., vol. 49, No. 1, pp. 19-36, Jan. 2005.

Morrow, P.R. et al., "Three-Dimensional Wafer Stacking Via Cu-Cu Bonding Integrated With 65-nm Strained-Si/Low-k CMOS Technology," IEEE Electron Device Letters, vol. 27, No. 5, pp. 335-337, May 2006, ISBN: 0741-3106.

Pienimaa, S.K. et al., "Stacked Thin Dice Package," Proceedings of the 51st Electronic Components and Technology Conference, 2001, pp. 361-366, IEEE.

Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract.

Schaper, L. et al., "Integrated System Development for 3-D VLSI," Electronic Components and Technology Conference, 2007, ECTC '07, Proceedings, 57th, May 29, 2007-Jun. 1, 2007, pp. 853-857.

Solberg, V., "Innovative 3-D Solutions for Multiple Die Packaging," SMTA International Conference, Sep. 21, 2003.

Takahashi, K. et al., "Current Status of Research and Development for Three-Dimensional Chip Stack Technology," Jpn. J. Appl. Phys., vol. 40 (2001), pp. 3032-3037, Part 1, No. 4B, Apr. 30, 2001, abstract.

Takahashi, K. et al., "Through Silicon Via and 3-D Wafer/Chip Stacking Technology," 2006 Symposium on VLSI Circuits Digest of Technical Papers.

(56) References Cited

OTHER PUBLICATIONS

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

Tezcan, D.S. et al., "Sloped Through Wafer Vias for 3D Wafer Level Packaging," Electronic Components and Technology Conference, 2007, ECTC '07, Proceedings, 57th, May 29, 2007-Jun. 1, 2007, pp. 643-647.

Thomas, D.J. et al., "Etching of Vias and Trenches Through Low k Dielectrics with Feature Sizes Down to 0.1 mm Using M0RIO High Density Plasmas," presented at the 197th Meeting of the Electrochemical Society, Toronto 2000, <http://www.trikon.com/pdfs/ECS2b.pdf>.

Trigas, C., "System-In-Package or System-On-Chip?," EE Times, Sep. 19, 2003, <http://www.eetimes.com/story/OEG20030919S0049>.

Vereecken, P.M. et al., "The chemistry of additives in damascene copper plating," IBM J. Res. & Dev., vol. 49, No. 1, pp. 3-18, Jan. 2005.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

XSiL, xise200 for vias and micro-machining, <http://www.xsil.com/products/index/html>, retrieved from the Internet on Aug. 16, 2003.

Yamamoto, S. et al., "Si Through-Hole Interconnections Filled with Au-Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

Ezawa, H. et al., "Pb-Free Bumping by Alloying Electroplated Metal Stacks," IEEE, 2003 Electronic Components and Technology Conference, May 2003, pp. 664-667.

\* cited by examiner

MICROFEATURE WORKPIECES HAVING CONDUCTIVE INTERCONNECT STRUCTURES FORMED BY CHEMICALLY REACTIVE PROCESSES, AND ASSOCIATED SYSTEMS AND METHODS

CROSS-REFERENCE TO RELATED APPLICATIONS

This application is a continuation of U.S. application Ser. No. 12/624,215 filed Nov. 23, 2009, now U.S. Pat. No. 7,629,249, which is a divisional of U.S. application Ser. No. 11/511,690 filed Aug. 28, 2006, now U.S. Pat. No. 7,973,411, each of which is incorporated herein by reference in its entirety.

TECHNICAL FIELD

The present disclosure is directed generally toward microfeature workpieces having conductive interconnect structures formed by chemically reactive processes, and associated systems and methods, including microfeature workpieces having conductive interconnect vias at least partially filled with copper sulfide.

BACKGROUND

Microelectronic imagers are used in digital cameras, wireless devices with picture capabilities, and many other applications. Many cell phones and Personal Digital Assistants (PDAs), for example, incorporate microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid-state systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect their delicate components and to provide external electrical contacts.

Many imaging devices include semiconductor dies having image sensors located on a front surface of the die to receive incoming radiation. The dies also include bond pads for electrically coupling the sensors to other circuit elements. In order to prevent the bond pads from interfering with the operation of the sensors, or limiting the size and/or location of the sensors, the bond pads can be positioned on the opposite side of the die from the sensors (e.g., on the back surface of the die). Through-wafer interconnects (TWIs) are used to conduct electrical signals from the sensors and associated internal circuitry, through the die to the bond pads at the back surface. The TWIs are typically formed by making a blind via in the die, filling the via with solder, and then grinding the back surface of the die to expose the blind end of the via, which is used to form the bond pad. A solder ball can then be attached to the bond pad and can be reflowed to couple the die to external devices.

One potential drawback associated with the foregoing approach is that, when the solder ball is later reflowed to electrically attach the die to external devices, the solder within the via may also tend to melt or at least soften. During the ensuing attach process, the solder within the via can be pulled at least partially out of the via, or can otherwise undergo deformations and/or movement that can adversely affect the electrical continuity of the TWI. In some instances, the electrical continuity of the TWI may be disrupted, causing the electrical connection between the image sensor and the external devices to fail.

Another potential drawback associated with the foregoing approach is that the number of steps required to produce the TWI increases the cost of making the associated die. For example, the use of solder in the blind via requires forming a vent hole to allow gases within the via to escape as the solder enters. Even so, the solder may include voids, which can disrupt electrical continuity and in subsequent processes, expand and create electrical shorts. Still further, the processes required to dispose the solder in the via are typically high-temperature processes, which can use up a significant portion of the thermal budget of the die. Accordingly, there is a need for an improved process for forming microfeature workpiece electrical connections, including connections between dies and external devices.

DETAILED DESCRIPTION

The following disclosure describes several embodiments of microfeature workpieces having conductive vias formed by chemically reactive processes, and associated systems and methods. Specific details of several embodiments of the invention are described below with reference to CMOS image sensors to provide a thorough understanding of these embodiments, but other embodiments can use CCD image sensors or other types of solid-state imaging devices. In still further embodiments, aspects of the invention can be practiced in connection with devices that do not include image sensors. Such devices include SRAM, DRAM, Flash, and other devices. In particular embodiments, the devices can be stacked on each other, and the vias can provide electrical communication among the stacked devices.

As used herein, the terms "microfeature workpiece" and "workpiece" refer to substrates on and/in which microfeature electronic devices (including, but not limited to, image sensors) are integrally formed. A microfeature workpiece can include a wafer, and/or individual dies or combinations of dies that make up the wafer. Typical microfeature electronic devices of the workpiece include microfeature electronic circuits or components, thin-film recording heads, data storage elements, microfluidic devices and other products. Micromachines and micromechanical devices are included within this definition because they are manufactured using much of the same technology that is used in the fabrication of integrated circuits. The substrates can be semi-conductive pieces (e.g., doped silicon wafers or gallium arsenide wafers), non-conductive pieces (e.g., various ceramic substrates), or conductive pieces. In some cases, the workpieces are generally round, and in other cases the workpieces can have other shapes, including rectilinear shapes. Several embodiments of systems and methods for forming conductive structures in connection with microfeature workpiece fabrication are described below. A person skilled in the relevant art will understand, however, that the invention has additional embodiments, and that the invention may be practiced without several of the details of the embodiments described below with reference to FIGS. 1A-3.

Figure 1A:
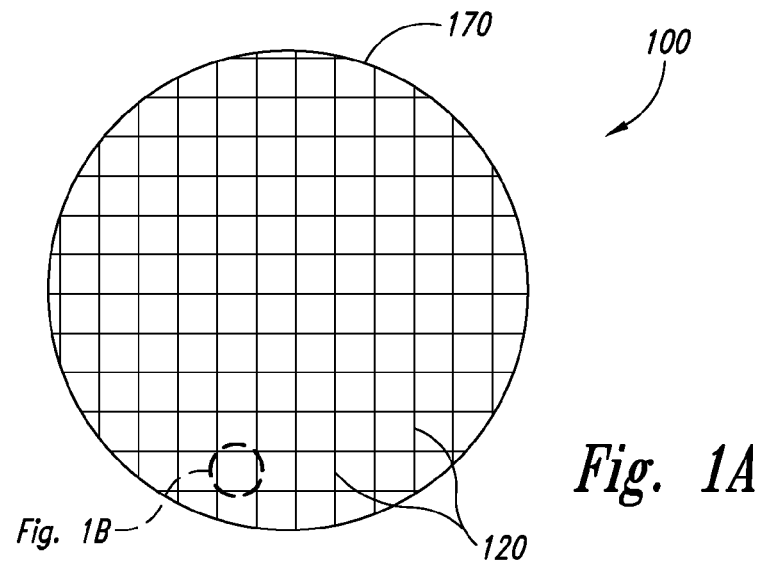
FIG. 1A is a partially schematic illustration of a representative microfeature workpiece carrying microfeature dies configured in accordance with embodiments of the invention.

FIG. 1A is a microfeature workpiece 100 in the form of a wafer 170 that includes multiple microfeature dies 120. At least some of the processes described below may be conducted on the microfeature workpiece 100 at the wafer level, and other processes may be conducted on the individual microfeature dies 120 of the microfeature workpiece 100 after the dies 120 have been singulated from the larger wafer 170. Accordingly, unless otherwise noted, structures and methods described below in the context of a "microfeature workpiece" can apply to the wafer 170 and/or the dies 120 that are formed from the wafer 170.

Figure 1B:
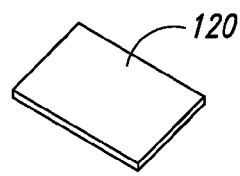
FIG. 1B is a schematic illustration of a microfeature die singulated from the workpiece shown in FIG. 1A.

FIG. 1B is a schematic illustration of an individual die 120 after it has been singulated from the wafer 170 shown in FIG. 1A. The die 120 can include operable microelectronic structure, optionally encased within a protective encapsulant. Pins, bond pads, solder balls, and/or other conductive structures provide electrical communication between structures within the die 120 and structures/devices located external to the die.

Figure 1C:
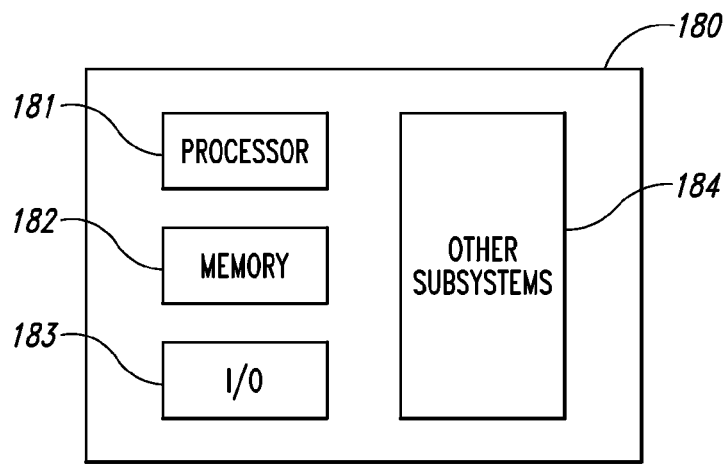
FIG. 1C is a schematic illustration of a system which can include one or more microfeature dies in accordance with embodiments of the invention.

Individual dies may be incorporated into any of a myriad of larger and/or more complex systems 180, a representative one of which is shown schematically in FIG. 1C. The system 180 can include a processor 181, a memory 182, input/output devices 183, and/or other subsystems or components 184. Microfeature workpieces (e.g., in the form of microfeature dies and/or combinations of microfeature dies) may be included in any of the components shown in FIG. 1C. The resulting system 180 can perform any of a wide variety of computing, processing, storage, sensor and/or other functions. Accordingly, representative systems 180 include, without limitation, computers and/or other data processors, for example, desktop computers, laptop computers, Internet appliances, hand-held devices (e.g., palm-top computers, wearable computers, cellular or mobile phones, multi-processor systems, processor-based or programmable consumer electronics, network computers, mini computers). Other representative systems 180 include cameras, light sensors, servers and associated server subsystems, display devices, and/or memory devices. Components of the system 180 may be housed in a single unit or distributed over multiple, interconnected units, e.g., through a communications network. Components can accordingly include local and/or remote memory storage devices, and any of a wide variety of computer-readable media, including magnetic or optically readable or removable computer disks.

Figure 1D:
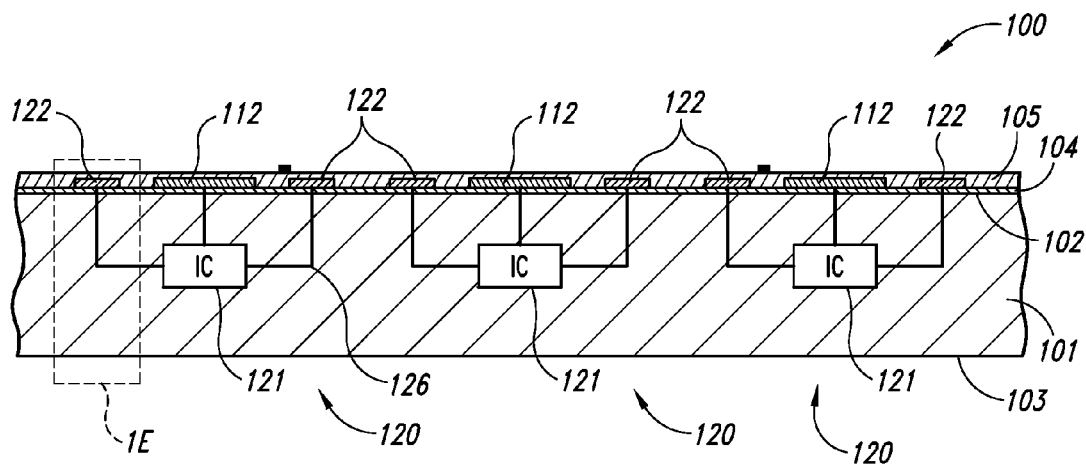
FIG. 1D is a partially schematic, cross-sectional illustration of a portion of the workpiece prior to formation of a conductive structure in accordance with an embodiment of the invention.

FIG. 1D is a side cross-sectional view of a portion of an imager workpiece 100 prior to the formation of conductive interconnect structures in accordance with an embodiment of the invention. The workpiece 100 can include a substrate 101 with a plurality of dies 120 (e.g., imaging dies) formed in and/or on the substrate 101. The substrate 101 has a first side or surface 102 and a second side or surface 103. The substrate 101 can be a semiconductor wafer, with the dies 120 arranged in a die pattern on the wafer. Individual dies 120 can include integrated circuitry 121, a plurality of terminals or bond sites 122 (e.g., bond pads) electrically coupled to the integrated circuitry 121 with couplers 126, and an image sensor 112. The image sensors 112 can be CMOS image sensors or CCD image sensors for capturing pictures or other images in the visible spectrum. In other embodiments, the image sensors 112 can detect radiation in other spectrums (e.g., IR or UV ranges). The bond sites 122 shown in FIG. 1D are external features at the first side 102 of the substrate 101. In other embodiments, however, the bond sites 122 can be internal features that are embedded at an intermediate depth within the substrate 101. First and second dielectric layers 104 and 105 can be located at the first side 102 to protect the underlying substrate 101.

Figure 1E:
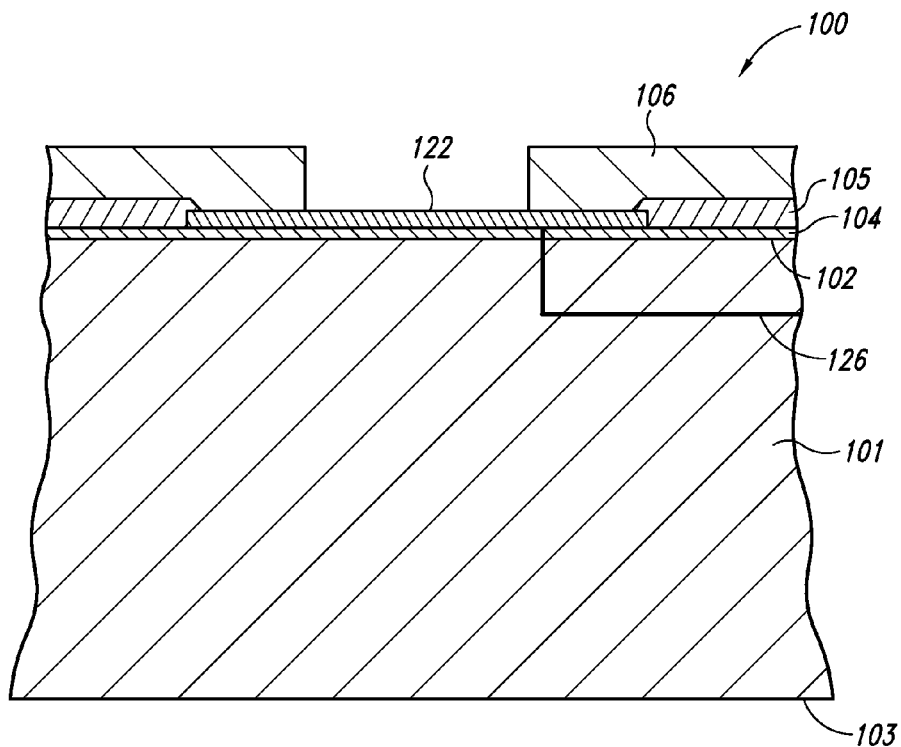
FIG. 1E is an enlarged view of a portion of the workpiece shown in FIG. 1A.

FIG. 1E is a side cross-sectional view of an area 1E shown in FIG. 1D. This portion of the workpiece 100 is representative of devices that include, but are not limited to, imager devices. Accordingly, the following discussion is also not limited to imager devices. The second dielectric layer 105 has been patterned and etched to expose the bond site 122. A mask 106 is applied over the second dielectric layer 105 and patterned, as shown in FIG. 1E. The mask 106 can be a layer of resist that is patterned according to the arrangement of bond sites 122 on the substrate 101. Accordingly, the mask 106 can have an opening over each bond site 122.

Figure 2A:
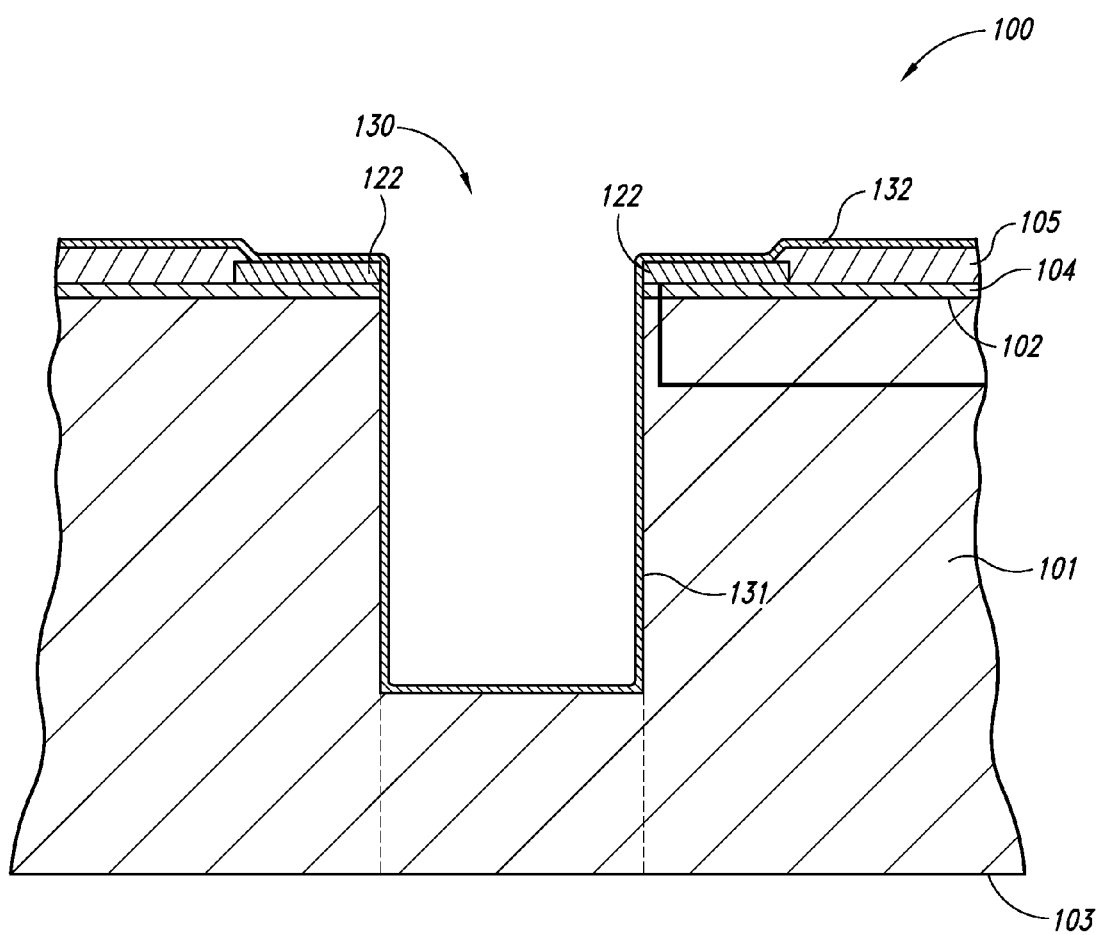
FIGS. 2A-2K illustrate a process for introducing conductive material in a via by using a chemical reaction in accordance with an embodiment of the invention.

Referring next to FIG. 2A, a via 130 has been formed in the workpiece 100 so as to extend into the substrate 101 through the bond site 122 and the first surface 102. The via 130 can be formed using any of a variety of techniques, including etching or laser drilling. The via 130 can be a blind via, as shown in FIG. 2A, e.g., a via that does not extend entirely through the workpiece 100 and/or the substrate 101. In other embodiments, the via 130 can extend entirely through the workpiece 100 and/or the substrate 101, as indicated in dashed lines in FIG. 2A. Further details of representative methods for forming the via 130 are disclosed in pending U.S. patent application Ser. No. 11/169,546, filed Jun. 28, 2005 and incorporated herein by reference. A third dielectric layer 132 is deposited onto the workpiece 100 to line the sidewalls 131 of the via 130 within the substrate 101. The third dielectric layer 132 electrically insulates components in the substrate 101 from an interconnect structure that is subsequently formed in the via 130.

Figure 2B:
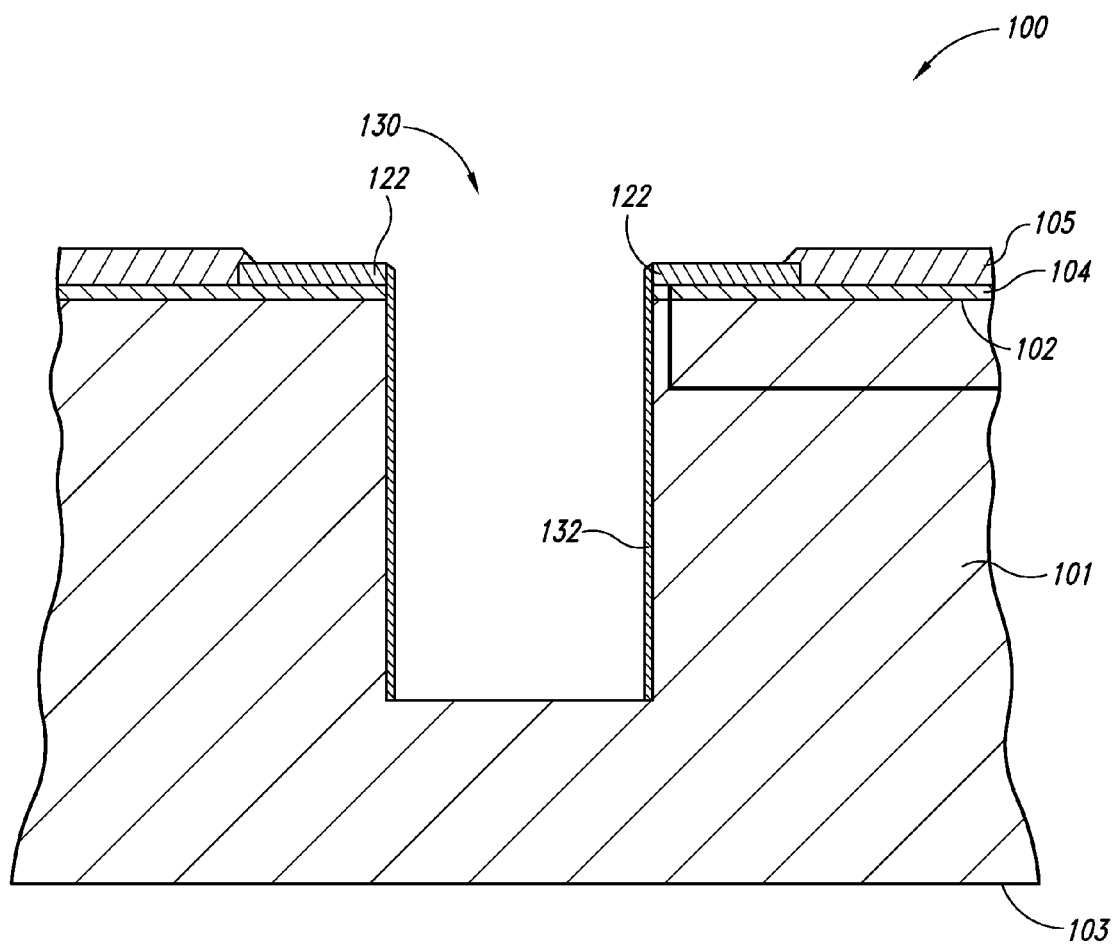

Referring to FIG. 2B, a suitable etching process (e.g., a spacer etch) is used to remove portions of the third dielectric layer 132 that extend over the bond site 122. Accordingly, at least part of the bond site 122 can be exposed for electrical coupling to conductive structures in the via 130, as is described in greater detail below.

Figure 2C:
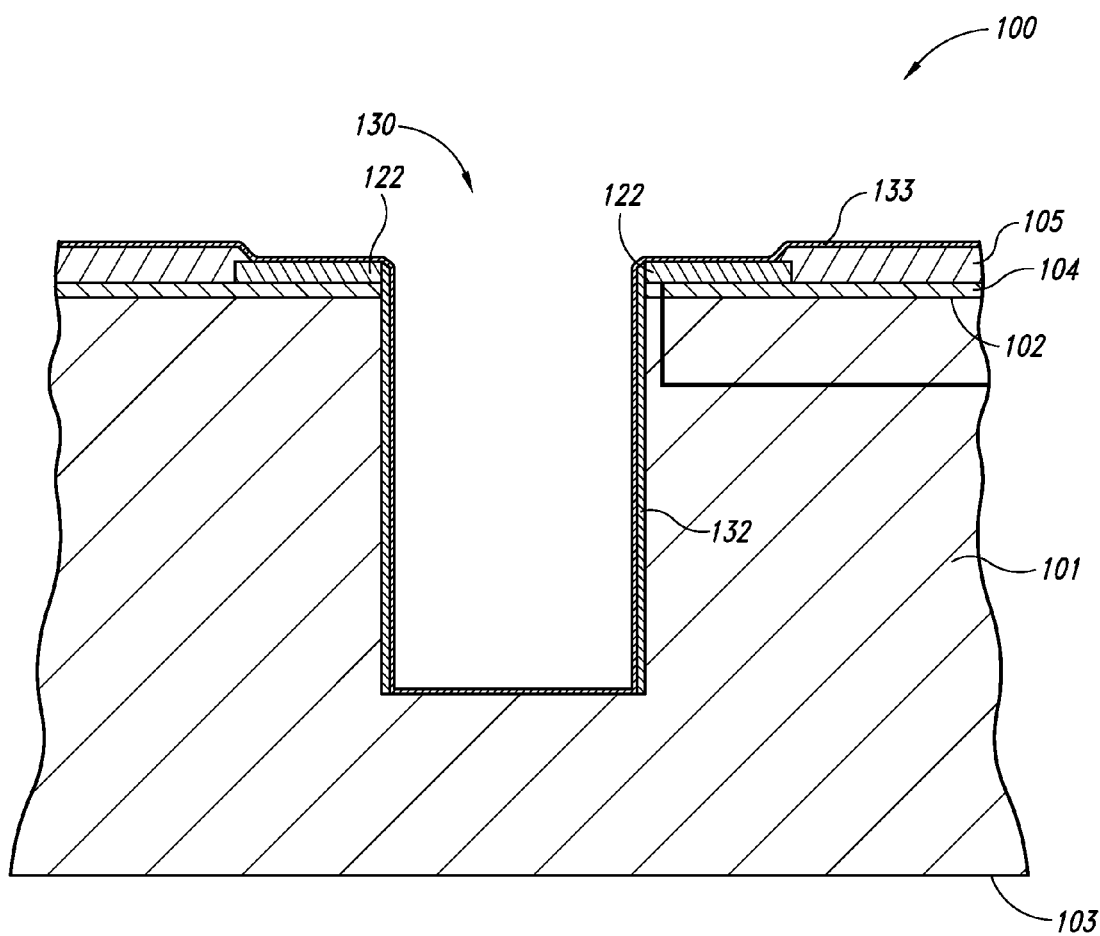

As shown in FIG. 2C, a conductive barrier layer 133 is then deposited onto the workpiece 100 over the third dielectric layer 132 so as to be in electrical contact with the bond site 122. The barrier layer 133 generally covers the second dielectric layer 105 and the bond site 122 in addition to the third dielectric layer 132. In one embodiment, for example, the barrier layer 133 is a layer of tantalum that is deposited onto the workpiece 100 using a physical vapor deposition (PVD) process. The thickness of the barrier layer 133 is about 150 Angstroms. In other embodiments, the barrier layer 133 may be deposited onto the workpiece 100 using other vapor deposition processes, such as chemical vapor deposition (CVD), and/or may have a different thickness. The composition of the barrier layer 133 is not limited to tantalum, but rather may be composed of tungsten or other suitable materials.

Figure 2D:
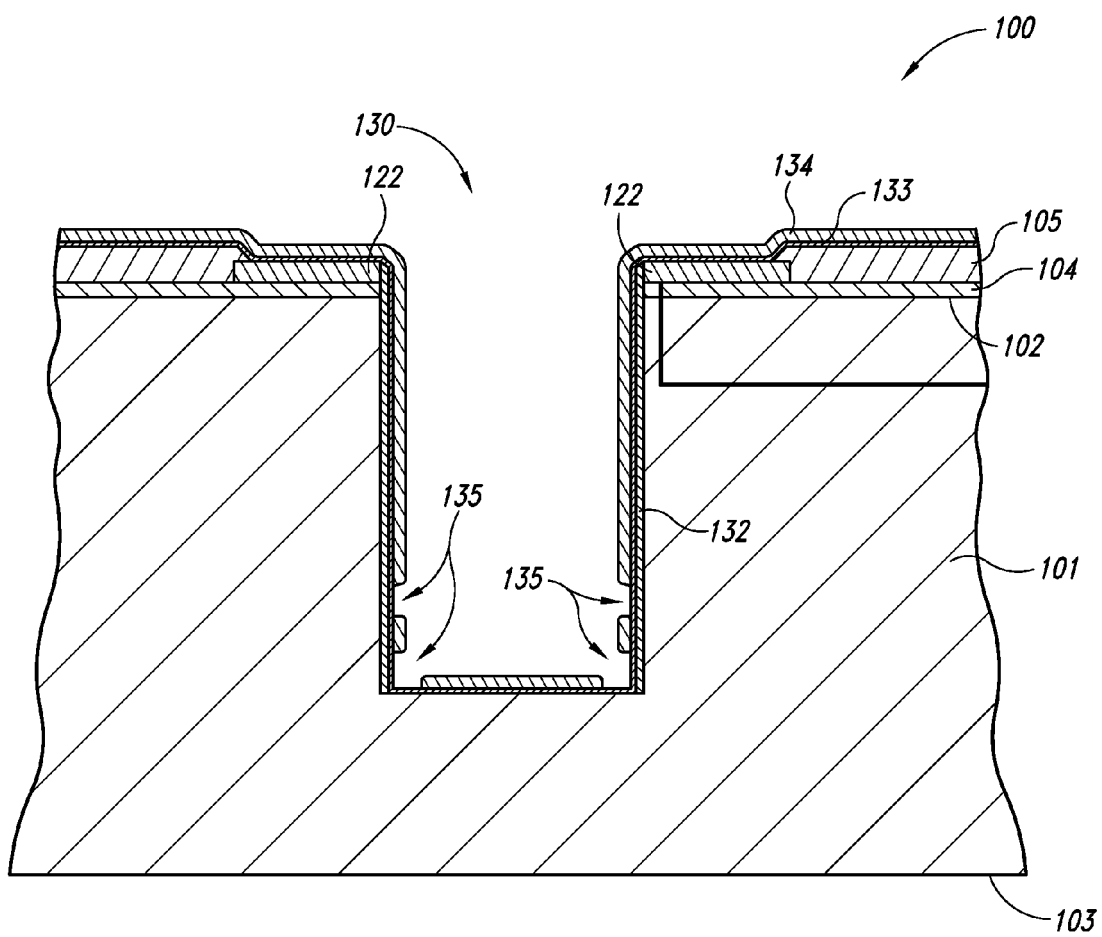
Figure 2E:
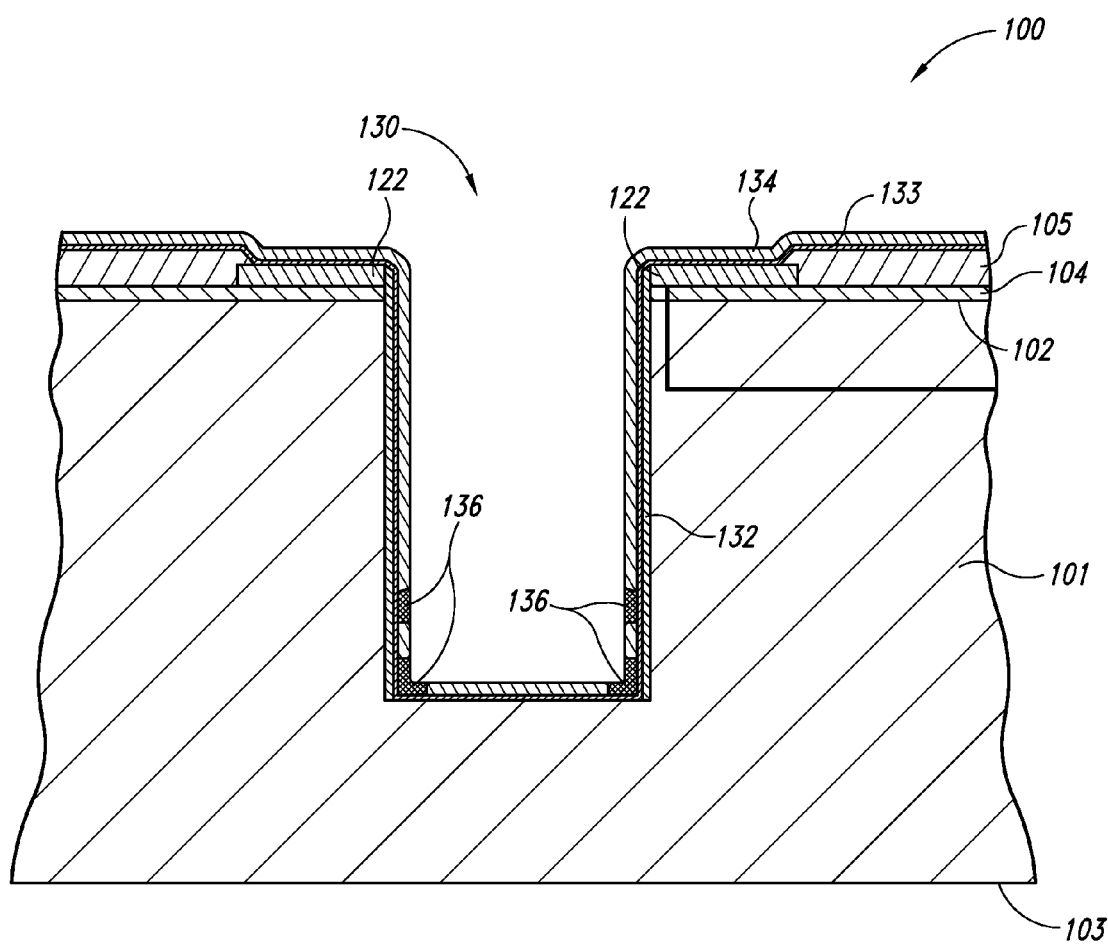

Referring next to FIG. 2D, a seed layer 134 is deposited onto the barrier layer 133. The seed layer 134 can be deposited using vapor deposition techniques, such as PVD, CVD, atomic layer deposition, and/or plating. The seed layer 134 can be composed of copper or other suitable materials. The thickness of the seed layer 134 may be about 2000 Angstroms, but can be more or less depending upon the depth and aspect ratio of the via 130. In several embodiments, the seed layer 134 may not uniformly cover the barrier layer 133, such that the seed layer 134 has voids 135 within the via 130. This can cause non-uniform electroplating in the via 130 and across the workpiece 100. When the seed layer 134 is deficient, it may be enhanced using a process that fills voids or noncontinuous regions of the seed layer 134 to form a more uniform seed layer. Referring to FIG. 2E, for example, voids 135 and/or noncontinuous regions of the seed layer 134 have been filled with additional material 136, such as copper or another suitable material. One suitable seed layer enhancement process is described in U.S. Pat. No. 6,197,181, which is incorporated by reference.

Figure 2F:
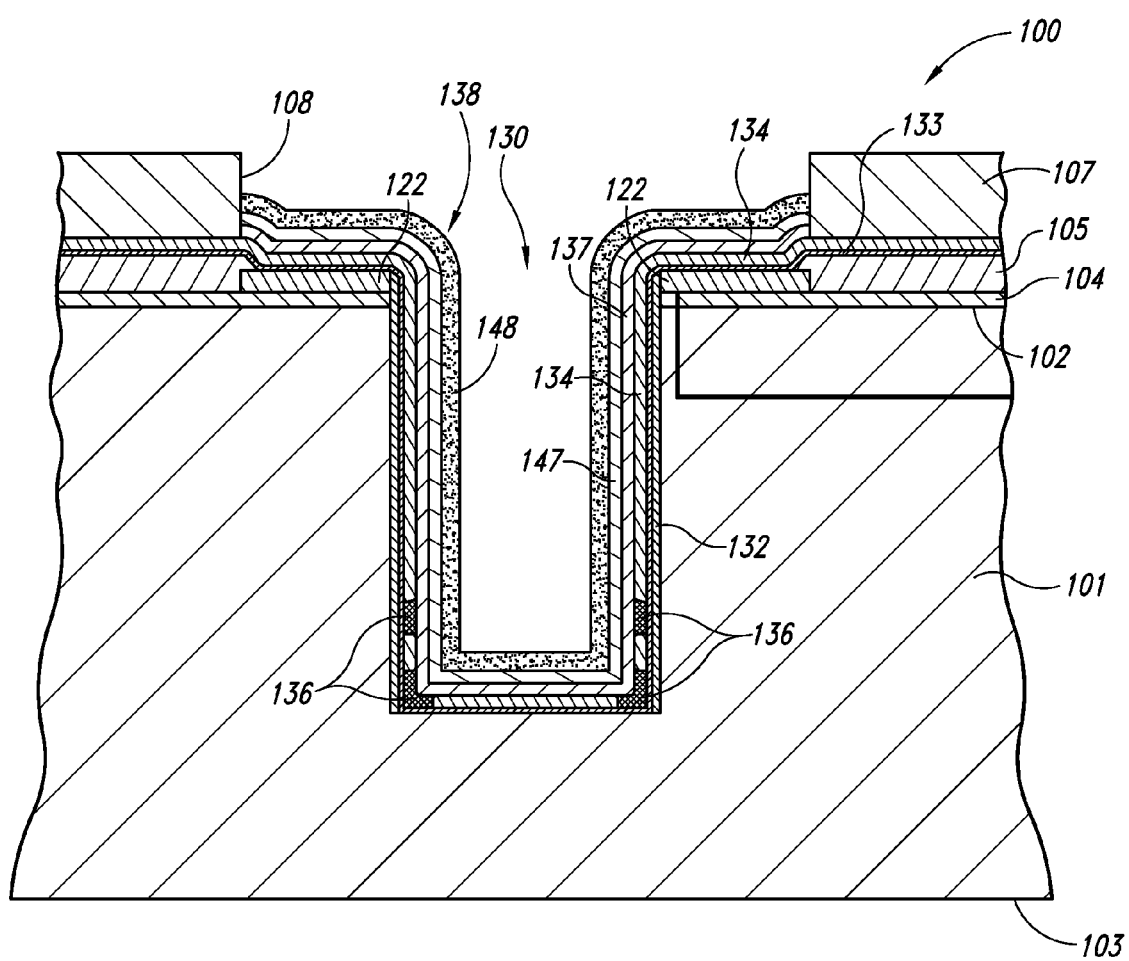
Figure 2G:
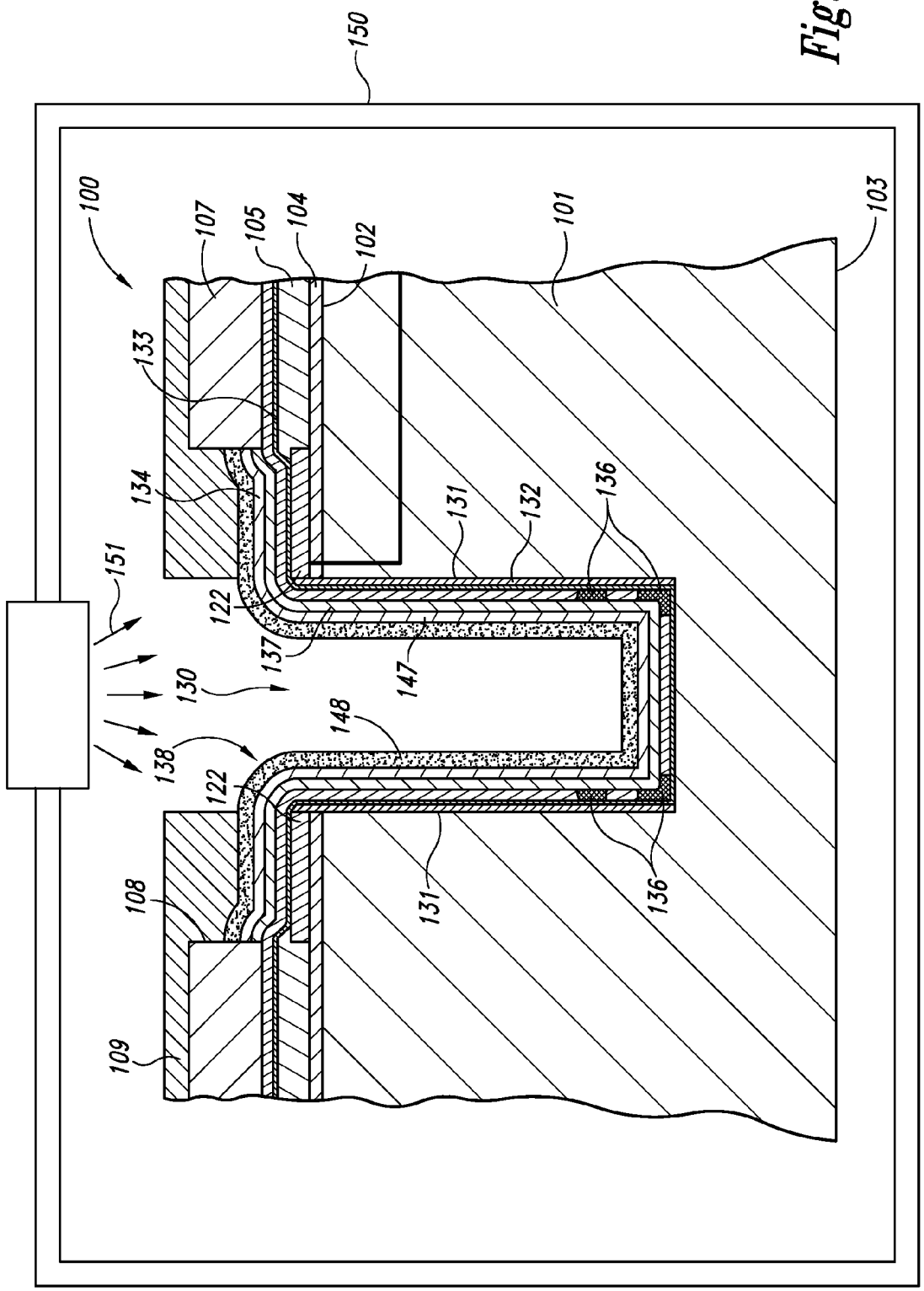

Referring next to FIG. 2F, a resist layer 107 is deposited onto the seed layer 134 and is patterned to have an opening 108 over the bond site 122 and the via 130. A first conductive lining or layer 137 is then deposited onto the exposed portions of the seed layer 134 in the via 130. The first conductive layer 137 can include copper that is deposited onto the seed layer 134 in an electroless plating operation, or an electroplating operation, or by another suitable method. In the illustrated embodiment, the thickness of the first conductive layer 137 is about 1 micron. In other embodiments, the first conductive layer 137 may include other suitable materials and/or have a different thickness. A second conductive layer 147 can then be deposited on the first conductive layer 137. The second conductive layer 147 can include nickel or another diffusion barrier that prevents or restricts migration of the material (e.g., copper) in the first conductive layer 137.

A third conductive layer 148 can then be disposed on the second conductive layer 147. The third conductive layer 148 can also include copper. The combined thicknesses of the conductive layers is such that a space is located between opposing portions of the last-formed layer that face each other across the via 130.

In particular embodiments, the third conductive layer 148 is deliberately configured so as to withstand a loss of material during the formation of a conductive chemical compound in the via 130. Accordingly, the thickness of the third conductive layer 148 can be selected based on how much material from the third conductive layer 148 is expected to be used up in the formation of the compound. The second conductive layer 147 can act as a barrier to limit the loss of material to material from the third conductive layer 148, and prevent a loss of material from the first conductive layer 137. Alternatively, the second conductive layer 147 and the third conductive layer 148 can be eliminated, and the first conductive layer 137 alone can be made thick enough to withstand the loss of material during the reaction process. Further details of an arrangement in which both the second and third layers 147, 148 are present are described below with reference to FIGS. 2H and 3. However, it will be understood that aspects of the invention may also be practiced with just the first conductive layer 137, provided it is thick enough. Further details of several embodiments for disposing the conductive layers in the via 130 are disclosed in U.S. patent application Ser. No. 11/169,838, filed Jun. 28, 2005 ,now U.S. Pat. No. 7,795134, and incorporated herein by reference.

In many existing processes, the open space in the via 130 is filled with solder (e.g., a mixture of tin, silver and/or other constituents), while the solder is in a liquid state. Accordingly, a vent hole is formed between the bottom of the via 130 and the second side 103 of the workpiece 101 to allow gases within the via 130 to escape as the solder enters. In certain embodiments of the present invention, this step can be eliminated. Instead, as shown schematically in FIG. 2G, the workpiece 100 can be placed in a reaction chamber 150 (e.g., a plasma chamber) and exposed to a reactive material 151 (e.g., a plasma). The reactive material 151 chemically reacts with one or more of the conductive layers in the via 130 to form a new chemical compound that fills or at least partially fills the via 130. A reaction mask 109 can be positioned over the conductive material at the bond site 122 (external to the via 130) to protect this portion of the conductive material from exposure to the reactive material 151. Accordingly, the reaction mask 109 can have openings that are about the same size as the openings in the mask 106 (FIG. 1B) used to form the vias 130.

In a particular embodiment, the reactive material 151 includes sulfur hexafluoride ($SF_6$), which chemically reacts with copper in the third conductive layer 148 or, if the second and third conductive layers 147, 148 are not included, then in copper present in the first conductive layer 137. The reaction between the sulfur hexafluoride and the copper in the via 130 forms enough copper sulfide ($Cu_xS_y$) to fill the open cross-sectional space of the via 130 over at least a portion of its length (and, in many embodiments, over the entire length of the space). The copper sulfide can include CuS, $Cu_2S$, $Cu_9S_5$, and/or other chemical combinations of copper and sulfur atoms. The copper sulfide in the via 130 may have a gradient of copper atoms, typically with more copper atoms toward the third conductive layer 148. For example, $Cu_2S$ may be present adjacent to the third conductive layer 148, and CuS may be present toward the center of the via 130.

Controlling the amount of copper in the newly formed chemical compound can in turn control the stability of the compound. For example, the compound can have a chemical formula of $Cu_xS$, with x greater than or equal to one, and less than or equal to two. Higher values of x within this range are expected to produce more stable compounds. In at least some cases, the compound can be annealed for additional stability.

In association with introducing the reactive material 151, the workpiece 100 can be exposed to a suitable reducing agent to remove copper oxides from the third conductive layer 148. For example, the workpiece 100 can be exposed to a hydrogen-nitrogen plasma in a chemical etch process, or an argon plasma in a mechanical etch process. Removing the oxide exposes the more reactive copper below, and results in better physical and electrical contact between the pre-existing copper and the newly formed copper sulfide. The oxide can be removed before or simultaneously with exposing the workpiece 100 to the reactive material 151.

Copper sulfide is a moderate conductor, and is generally less conductive than pure copper. Accordingly, if the dies formed from the workpiece 101 require a higher conductivity in the via 130 than is provided by copper sulfide, the process is performed so as to leave at least some copper in the via 130. For example, if the third conductive layer 148 is not entirely consumed in the reaction with the sulfur hexafluoride, some copper will remain in the third conductive layer 148. If the entire third conductive layer 148 is consumed in the chemical reaction, then the second conductive layer 147 can act as a stop layer and can accordingly preserve the copper in the first conductive layer 137 to provide a relatively high conductivity link in the via 130. In still another embodiment, in which the second and third conductive layers 147, 148 are not present, the amount of copper present in the first conductive layer 137 can exceed the amount copper consumed in the reaction that forms the copper sulfide so as to provide the relatively high conductivity link. On the other hand, if the copper sulfide alone provides sufficient conductivity in the via 130 for the intended purposes of the resulting die, the entire amount of copper present at the walls 131 of the via 130 can be used up in the chemical reaction with the sulfur hexafluoride.

Figure 2H:
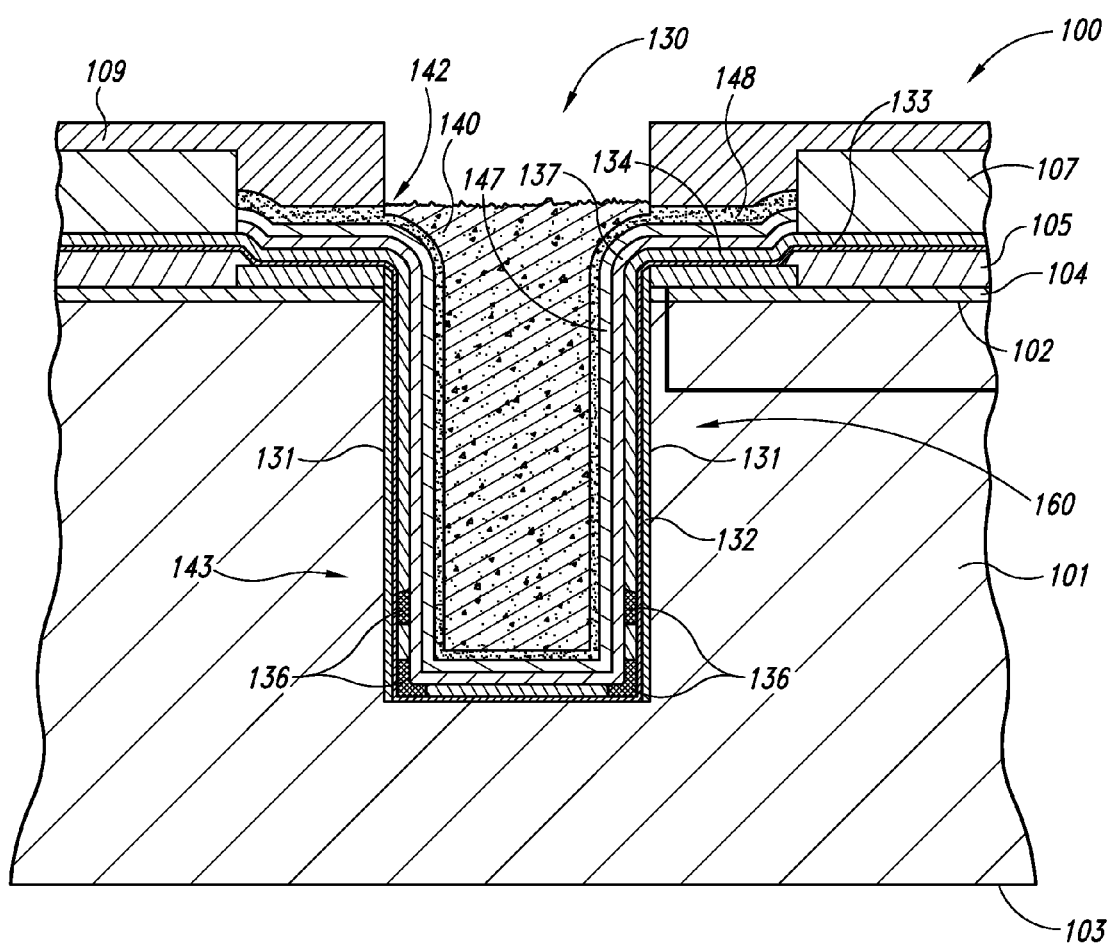

FIG. 2H illustrates a volume of a conductive compound 140 (e.g., the copper sulfide or another fill material) formed in the via 130 using the foregoing chemical process. Accordingly, the conductive compound 140 can include at least one constituent from the plasma 151 (FIG. 2G), and at least one constituent from the side walls 131 of the via 130. The conductive compound 140, together with any other electrically conductive materials in the via 130, can form an interconnect structure 160. The interconnect structure 160 has a first end 142 proximate to the bond site 122, and a second end 143 toward the bottom of the via 130. In an embodiment illustrated in FIG. 2H, the conductive compound 140 fills or at least approximately fills the remaining volume in the via 130. In other embodiments, the conductive compound 140 can be used to fill only a portion of the via 130.

After the conductive compound 140 is formed in the via 130, the workpiece 100 can be further processed prior to coupling it to other components. For example, referring to FIG. 2I, the reaction mask 109 (FIG. 2H) and the resist layer 107 (FIG. 2H) are removed (e.g., by a stripping process), as are the portions of the seed layer 134 and the barrier layer 133 that extend beyond the bond site 122 (e.g., using a wet chemistry etch and a dry plasma etch, respectively). A CMP process can be used to flatten the surface (as will be described below with reference to FIG. 2K), or the remaining conductive structures can form a stud, as shown in FIG. 2I.

Figure 2I:
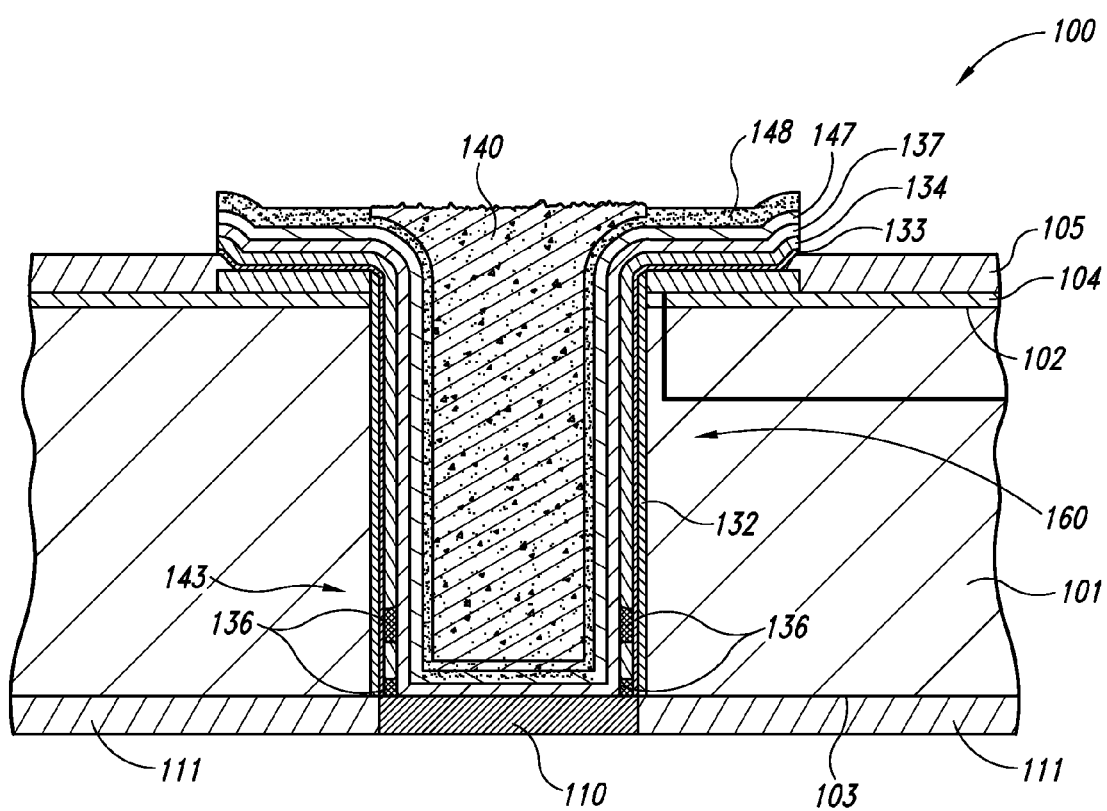

As is also shown in FIG. 2I, material from the second side 103 of the workpiece 100 can be removed in a backgrinding process to expose the conductive material at the second end 143 of the interconnect structure 160. A passivation layer 111 can be added to the second side 103 of the workpiece 100, and a bond pad 110 can be formed at the second end 143 of the interconnect structure 160 to facilitate bonding the workpiece 100 to other devices and/or structures. In a particular aspect of this embodiment, material can be removed from the second side 103 until the first conductive layer 137 is exposed. In other embodiments, additional material can be removed to expose the second conductive layer 147, the third conductive layer 148, or the conductive compound 140.

Figure 2J:
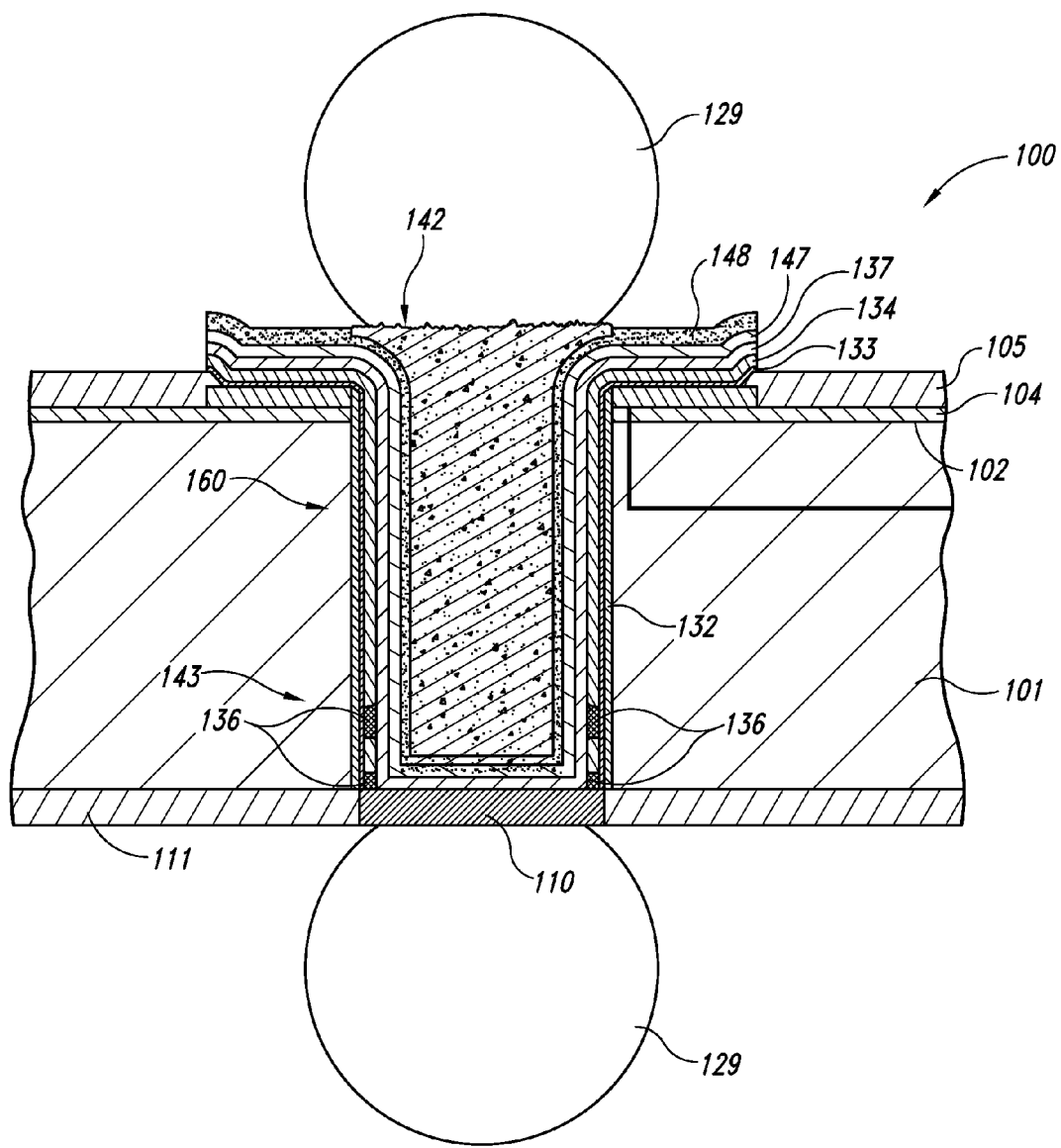
Figure 2K:
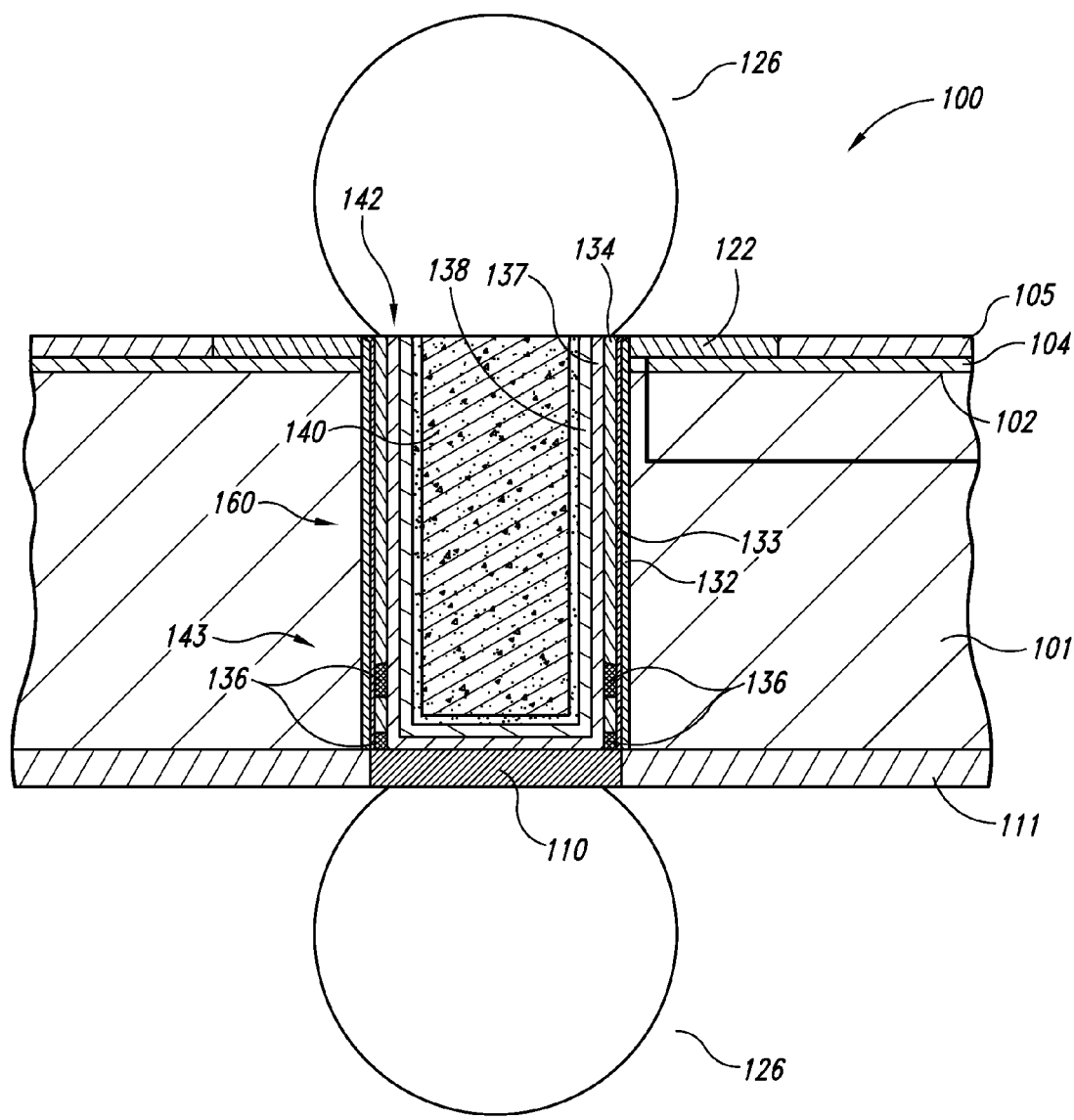

FIG. 2J illustrates the workpiece 100 after the reaction mask 109 (FIG. 2I) has been removed. At this point, conductive couplers 129 (e.g., solder balls or stud bumps) can be attached to the workpiece 100 at the bond pad 110 and at the first end 142 of the interconnect structure 160. Whether conductive couplers 129 are attached to the first end 142, the second end 143, or both ends of the interconnect structure 160 can depend on factors that include the characteristics of the workpiece 100 and/or the uses to which the workpiece 100 will be put. For example, if the workpiece 100 includes an imager die, it typically will include conductive couplers 129 at the second end 143 but not the first end 142. If the workpiece 100 includes a DRAM die, it may include conductive couplers 129 at both the first and second ends 142, 143 if it is to be placed in the middle of a stack of such dies, or at only one end if it is to be placed at the top or bottom of such a stack. In another arrangement, shown in FIG. 2K, the first end 142 of the interconnect structure 160 can be further processed to expose the bond site 122 at the first end 142. Accordingly, suitable etching, CMP, and/or other processes can be used to remove the materials (including a portion of the conductive compound 140) overlying the bond site 122. Conductive couplers 126 (shown as solder balls in FIG. 2K) are then attached to the workpiece 100 at the bond site 122 and the bond pad 110 to electrically connect the workpiece 100 to other workpieces (e.g., in a stacked arrangement), and/or to other components, for example, printed circuit boards, interposer boards, and/or any of a myriad of other suitable structures or devices.

Embodiments of the process described above with reference to FIGS. 1A-2K include disposing a conductive lining on the walls of a via 130 in a microfeature workpiece 100, with opposing portions of the lining facing toward each other from opposing portions of the wall and bordering a space within the via. The method can further include chemically reacting the lining with a reactive material to form a chemical compound from a constituent of the reactive material and a constituent of the lining. The method can still further include at least partially filling the space with the chemical compound. In a particular embodiment, the chemical reaction is between copper and sulfur hexafluoride and forms copper sulfide, though it can be between (or among) other constituents in other embodiments. The chemical reaction is expected to proceed quickly, which can reduce the amount of time required to form the conductive interconnect structure 160 in the workpiece 100. In particular, the reaction is expected to proceed more quickly than the process of disposing a solder material in the via 130, or plating material into the via 130. The resulting microfeature workpiece can include a microfeature substrate having a via with opposing via wall portions, and a first conductive material disposed in a layer adjacent to the opposing wall portions. The workpiece can further include a second conductive material disposed adjacent to the first conductive material, with the second conductive material entirely filling a cross-sectional dimension of the via between opposing portions of the layer over at least part of a length of the via. The second conductive material can include a chemical compound that in turn includes a constituent of the layer. For example, the first conductive material can include copper, and the second conductive material can include copper sulfide. In further particular aspects, neither of the conductive materials includes tin or lead or solder.

In particular embodiments, the via can be made to extend through less than an entire thickness of the workpiece (e.g., forming a blind via), and reacting the lining can include reacting the lining without first opening a vent hole at a blind end of the via opening. As discussed above, the vent hole is typically provided in the via to allow gases to escape from the via as liquid solder is disposed in the via. Because certain embodiments described above include a chemical reaction process rather than flowing liquid solder into the via, the need for a vent hole is eliminated. This not only eliminates the amount of time required to form the vent hole, but also eliminates the potential for damage to, and/or contamination of, the workpiece 101 which may result from forming the vent hole.

In at least some of the embodiments described above, the conductive compound 140 is expected to be free or essentially free of voids. It is expected that the conductive compound 140 can form a more continuous electrical path in the interconnect structure 160. The absence of voids can also reduce or eliminate the presence of gas molecules in the interconnect structure 160, which might otherwise expand and potentially damage the interconnect structure 160 when the workpiece 100 undergoes subsequent processes at elevated temperatures.

The formation of the chemical compound in the via can be performed at relatively low temperatures. For example, the workpiece 100 can be exposed to a sulfur hexafluoride plasma at a temperature of about 60° C. This temperature may be varied and controlled to achieve a target reaction rate. This is unlike the process of filling the via 130 with solder, which requires an elevated temperature and which can accordingly use up a portion of the limited thermal budget associated with the workpiece 100. As a result, workpieces 100 that include interconnect structures formed in the manners described above are expected to be more robust because the workpieces 100 may be exposed to fewer high temperature processes. Furthermore, solder typically requires flux to remove surface oxides and provide for a good electrical and physical connection between the solder and the adjacent conductive structure. Embodiments of the chemical reactions described above do not require flux, and oxide removal can instead be performed by exposing the workpiece to a suitable plasma, prior to introducing the reactive material. This process is expected to be faster and/or more efficient than using a flux.

Still further, the conductive compound 140 can have a melting point higher than that of solder. For example, $Cu_2S$ has a reported melting point of 1100° C. and CuS has a reported decomposition temperature of about 220° C. $Cu_2S$ is expected to have a decomposition temperature in the range of 327° C. to 527° C. when on platinum, and a decomposition temperature of about 677° C. when on ruthenium. Accordingly, when the temperature of the workpiece 100 is elevated during subsequent process step (e.g., reflow steps), the conductive compound 140 within the via 130 will not tend to reflow, melt, or otherwise change phase. As a result, the interconnect structure 160 is expected to be more physically and electrically robust than are many existing interconnect structures.

Figure 3:
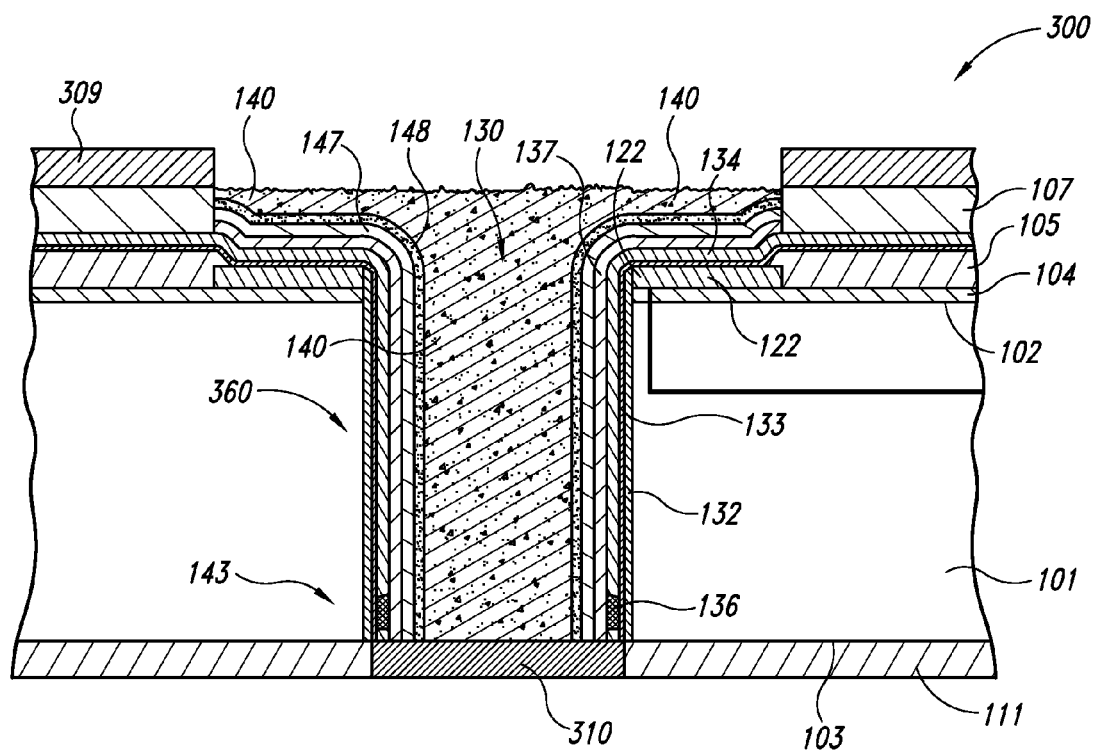
FIG. 3 is an illustration of a substrate having features in accordance with another embodiment of the invention.

FIG. 3 illustrates a workpiece 300 having certain structures that differ from the workpiece 100 described above with reference to FIGS. 1A-2K. For example, the workpiece 300 can include an interconnect structure 360 having a different lateral extent than that of the interconnect structure 160 described above. In a particular arrangement, the conductive material extending laterally away from the via 130 (e.g., in the conductive layers 137, 147, 148) is not protected by a mask during the chemical reaction process. Instead, a reaction mask 309 having larger openings than those of the reaction mask 109 (FIG. 2G) is positioned over the workpiece 100. Accordingly, the conductive compound 140 formed in the chemical reaction also extends laterally away from the via 130. A solder ball or other conductive coupler can be attached directly to the laterally-extending conductive compound 140, for example, if the conductivity of the conductive compound 140 is high enough. If it is not, the conductive compound 140 and other materials overlying the bond site 122 can be removed to expose the (generally more conductive) bond site 122. Though not shown in FIG. 3, the reaction mask 309, and the resist layer 107 will be removed, as will those portions of the seed layer 134 and the barrier layer 133 that extend beyond the bond site 122, as was discussed above with reference to FIG. 2I. As is also shown in FIG. 3, more of the second surface 103 of the workpiece 300 can be removed via a backgrinding process or other process than in the arrangement shown in FIG. 2K, to expose the conductive compound 140 within the via 130. An appropriate bond pad 310 can be formed at the exposed second end 143 of the interconnect structure 360 to prevent oxidation or another undesirable chemical reaction at the exposed second end 143 of the conductive compound 140. The processing environment during the backgrinding process can be controlled by the introduction of a suitable gas to prevent such reactions. In other embodiments, the backgrinding process can stop at other locations within the via (e.g., at the barrier layer 133).

Particular embodiments of the foregoing processes were described in the context of a reaction between copper and sulfur hexafluoride to form a copper sulfide. In other embodiments, the process can include other "sulfiding" reactions. For example, other metals (Ni, Sn, Co, Zn or Fe) can be reacted with an $SF_6$ plasma to form corresponding sulfides (NiS, $SnS_2$, CoS, ZnS, or $FeS/FeS_2$, respectively). In further embodiments, other non-sulfiding reactions can be used to form other suitable compounds. Suitable compounds include borides, phosphides, and silicides. For example, metals such as Ni or Fe can be exposed to a $BF_3$ or $B_2H_6$ plasma to form $Ni_2B/Ni_3B$ or FeB, respectively. In still further embodiments, metals can be exposed to a $PF_5$ or $PH_3$ plasma to form $FeP/Fe_2P/Fe_3P$, $Ni_2P$, $Co_2P$ or $Zn_3P_2$. A $SiH_4$ plasma can be used to form $Ni_2Si/NiSi_2$, $Cu_5Si$ or $CoSi_2$. In still further embodiments, the processes can include other reactions between conductive elements or compounds, and suitable reactive plasmas or other chemistries.

From the foregoing, it will be appreciated that specific embodiments of the invention have been described herein for purposes of illustration, but that various modifications may be made without deviating from the invention. For example, structures and/or processes described in the context of particular embodiments may be combined or eliminated in other embodiments. In particular, other embodiments can include other conductive compounds and/or conductive compounds formed from other constituents than those specifically described above. The connections between the interconnect structure and other devices (e.g., bond pads, conductive couplers and/or external devices) can have arrangements different than those described above. Accordingly, the invention is not limited except as by the appended claims.

I claim:

1. A microfeature workpiece, comprising:
   a substrate having a first surface, a second surface, and a via, wherein the via has opposing wall portions extending entirely through the substrate;
   a bond site carried by the substrate, wherein the opposing wall portions extend through the bond site; and
   a copper compound substantially filling the via, wherein the bond site is electrically accessible from the second surface of the substrate via the copper compound.

2. The microfeature workpiece of claim 1, further comprising an image sensor at the first surface of the substrate.

3. The microfeature workpiece of claim 1, further comprising a conductive material positioned inwardly from the opposing wall portions of the via, wherein the conductive material defines a region between the opposing wall portions having a cross-sectional dimension and a length generally transverse to the cross-sectional dimension, and wherein the copper compound at least substantially fills the cross-sectional dimension of the region over at least a portion of the length.

4. The microfeature workpiece of claim 1 wherein the copper compound comprises copper sulfide ($Cu_xS$), and wherein x is between 1 and 2.

5. The microfeature workpiece of claim 1 wherein the copper compound is substantially free of voids.

6. The microfeature workpiece of claim 1 wherein the via does not include tin, lead, or solder.

7. The microfeature workpiece of claim 1 wherein:
the copper compound comprises copper sulfide; and
the microfeature workpiece further comprises a conductive material between the copper compound and the opposing wall portions of the via, the conductive material comprising copper.

8. The microfeature workpiece of claim 7 wherein the copper sulfide includes a gradient of copper atoms that decreases in a direction away from the first conductive material.

9. The interconnect structure of claim 1, further comprising:
a barrier material positioned inwardly from the opposing wall portions;
a seed material positioned inwardly from the barrier material; and
a conductive material between the seed material and the copper compound.

10. A microfeature workpiece, comprising:
a substrate having a thickness;
a bond site carried by the substrate; and
an interconnect structure extending through the thickness of the substrate and through the bond site, the interconnect structure having a sidewall, a first conductive material inward from the sidewall, and a second conductive material inward from the first conductive material, wherein the second conductive material at least partially fills a remaining portion of the interconnect structure, and wherein the second conductive material comprises a conductive compound that includes a constituent of the first conductive material.

11. The microfeature workpiece of claim 10 wherein the first conductive material comprises copper and the second conductive material comprises copper sulfide.

12. The microfeature workpiece of claim 10 wherein the second conductive material comprises copper sulfide, and wherein the copper sulfide includes a concentration of copper that varies across a cross-sectional dimension of the interconnect structure.

13. The microfeature workpiece of claim 10 wherein:
the substrate has a first surface and a second surface opposite the first surface, the thickness of the substrate being between the first and second surfaces; and
the second conductive material extends laterally along the first surface of the substrate.

14. The microfeature workpiece of claim 10 wherein each of the first and second conductive materials have melting points higher than that of solder.

15. The microfeature workpiece of claim 10 wherein:
the substrate has a first surface and a second surface opposite the first surface, the thickness of the substrate being between the first and second surfaces; and
the interconnect structure includes a first end portion proximate the first surface of the substrate, a second end portion proximate the second surface of the substrate, and a bond pad at the second end portion.

16. The microfeature workpiece of claim 15, further comprising a conductive coupler connected to at least one of the first end portion of the interconnect structure or the bond pad.

17. The microfeature workpiece of claim 10, further comprising an image sensor electrically coupled to the interconnect structure via the bond site.

18. The microfeature workpiece of claim 10 wherein:
the substrate has a first surface and a second surface opposite the first surface, the thickness of the substrate being between the first and second surfaces;
the bond site is at the first surface of the substrate;
the first conductive material comprises copper;
the second conductive material comprises copper sulfide;
the interconnect structure further comprises a barrier material and a seed material sequentially on one another adjacent to the sidewall such that the first conductive material is on the seed material, and a diffusion barrier between the first conductive material and the second conductive material; and
the microfeature workpiece further comprises an image sensor at the first surface of the substrate and electrically coupled to the interconnect structure.

19. A system, comprising:
a processor; and
a microfeature die including a substrate, a bond site carried by the substrate, and an interconnect structure extending through the substrate and the bond site, the bond site being electrically accessible from a back side of the substrate via the interconnect structure, wherein the interconnect structure includes a first conductive material inward from a sidewall of the interconnect structure and a second conductive material at least substantially filling a remainder of the interconnect structure, and wherein the first and second conductive materials do not include solder, the second conductive material comprising a conductive compound that includes a constituent of the first conductive compound.

20. The microfeature system of claim 19 wherein the first conductive material comprises copper, and wherein the second conductive material comprises copper sulfide.

21. The microfeature system of claim 19 wherein:
the bond site is at a front side of the substrate; and
the microfeature die further includes an image sensor at the front side of the substrate, the image sensor being electrically coupled to the interconnect structure via the bond site.

* * * * *

UNITED STATES PATENT AND TRADEMARK OFFICE
CERTIFICATE OF CORRECTION

PATENT NO.        : 8,610,279 B2                             Page 1 of 1
APPLICATION NO.   : 13/169134
DATED             : December 17, 2013
INVENTOR(S)       : Swarnal Borthakur It is certified that error appears in the above-identified patent and that said Letters Patent is hereby corrected as shown below:

On the title page, item (73), in "Assignee", in column 1, line 1, delete "Technologies," and insert -- Technology, --, therefor.

In the Specification

In column 1, lines 11-12, delete "7,629,249," and insert -- 7,973,411, --, therefor.

In column 1, line 13, delete "7,973,411," and insert -- 7,629,249, --, therefor.

Signed and Sealed this
First Day of April, 2014

Michelle K. Lee
*Deputy Director of the United States Patent and Trademark Office*